US010910390B2

United States Patent
Pu et al.

(10) Patent No.: US 10,910,390 B2
(45) Date of Patent: Feb. 2, 2021

(54) MEMORY DEVICE AND FORMING METHOD THEREOF

(71) Applicant: Yangtze Memory Technologies Co., Ltd., Hubei (CN)

(72) Inventors: Yue Qiang Pu, Hubei (CN); Jin Wen Dong, Hubei (CN); Jun Chen, Hubei (CN); Zhenyu Lu, Hubei (CN); Qian Tao, Hubei (CN); Yushi Hu, Hubei (CN); Zhao Hui Tang, Hubei (CN); Li Hong Xiao, Hubei (CN); Yu Ting Zhou, Hubei (CN); Sizhe Li, Hubei (CN); Zhaosong Li, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 16/046,042

(22) Filed: Jul. 26, 2018

(65) Prior Publication Data

US 2019/0326308 A1 Oct. 24, 2019

Related U.S. Application Data

(63) Continuation of application No. PCT/CN2018/083718, filed on Apr. 19, 2018.

(51) Int. Cl.
*G11C 16/04* (2006.01)
*H01L 27/11556* (2017.01)
(Continued)

(52) U.S. Cl.
CPC .... *H01L 27/11556* (2013.01); *G11C 16/0483* (2013.01); *H01L 27/0605* (2013.01);
(Continued)

(58) Field of Classification Search
CPC ............ H01L 29/7827; H01L 29/7926; H01L 27/11556; H01L 27/11582; H01L 27/0688; H01L 27/11568; G11C 16/0483
See application file for complete search history.

(56) References Cited

U.S. PATENT DOCUMENTS 9,595,346 B2    3/2017  Lee et al.
9,722,074 B2    8/2017  Koval et al.
(Continued)

FOREIGN PATENT DOCUMENTS

CN    102623437 A    9/2012
CN    104981904 A    10/2015
(Continued)

OTHER PUBLICATIONS

International Search Report and Written Opinion of the International Searching Authority directed to related International Patent Application No. PCT/CN2018/083718, dated Jan. 8, 2019; 8 pages.

*Primary Examiner* — Uyen Smet
(74) *Attorney, Agent, or Firm* — Sterne, Kessler, Goldstein & Fox P.L.L.C.

(57) ABSTRACT

Methods and structures of a three-dimensional memory device are disclosed. In an example, the memory device includes a substrate having one or more first recesses in a first region and one or more second recesses in a second region. A liner layer is disposed over the sidewalls and bottom of the one or more first recesses in the first region and an epitaxially-grown material is formed in the one or more second recesses in the second region. One or more NAND strings are formed over the epitaxially-grown material disposed in the one or more second recesses, and one or more vertical structures are formed over the one or more first recesses in the first region.

20 Claims, 15 Drawing Sheets

(51) Int. Cl.
*H01L 27/11568* (2017.01)
*H01L 27/11582* (2017.01)
*H01L 27/06* (2006.01)
*H01L 29/78* (2006.01)
*H01L 29/792* (2006.01)

(52) U.S. Cl.
CPC .... *H01L 27/0688* (2013.01); *H01L 27/11568* (2013.01); *H01L 27/11582* (2013.01); *H01L 29/7827* (2013.01); *H01L 29/7926* (2013.01)

(56) References Cited

U.S. PATENT DOCUMENTS

| | | | |
|---|---|---|---|
| 9,853,043 B2 | 12/2017 | Lu et al. | |
| 10,153,292 B2 | 12/2018 | Kim et al. | |
| 2007/0140001 A1* | 6/2007 | Motoi | H01L 27/115 365/180 |
| 2007/0243680 A1* | 10/2007 | Harari | G11C 16/0483 438/257 |
| 2015/0318301 A1* | 11/2015 | Lee | H01L 29/7926 257/324 |
| 2016/0104623 A1 | 4/2016 | Xinpeng | |
| 2017/0040337 A1* | 2/2017 | Kim | H01L 27/11582 |
| 2017/0092654 A1 | 3/2017 | Nishikawa et al. | |
| 2017/0179026 A1 | 6/2017 | Toyama et al. | |

FOREIGN PATENT DOCUMENTS

| | | |
|---|---|---|
| CN | 105097811 A | 11/2015 |
| CN | 106169307 A | 11/2016 |
| CN | 106449648 A | 2/2017 |
| CN | 107305891 A | 10/2017 |
| CN | 107431072 A | 12/2017 |
| CN | 107810552 A | 3/2018 |
| CN | 107887395 A | 4/2018 |
| EP | 3193354 A1 | 7/2017 |
| WO | WO 2016/200742 A1 | 12/2016 |
| WO | WO 2019/104896 A1 | 6/2019 |

\* cited by examiner

MEMORY DEVICE AND FORMING METHOD THEREOF

CROSS REFERENCE TO RELATED APPLICATIONS

This application is a continuation of PCT Application No. PCT/CN2018/083718, filed on Apr. 19, 2018, the disclosure of which is incorporated by reference herein in its entirety.

BACKGROUND

Embodiments of the present disclosure relate to three-dimensional (3D) memory devices and fabrication methods thereof.

Flash memory devices have undergone rapid development. Flash memory devices can store data for a considerably long time without powering, and have advantages such as high integration level, fast access, easy erasing, and rewriting. To further improve the bit density and reduce cost of flash memory devices, three-dimensional NAND flash memory devices have been developed.

A three-dimensional NAND flash memory device includes a stack of gate electrodes arranged over a substrate, with a plurality of semiconductor channels through and intersecting word lines, into the p- and/or n-type implanted substrate. The bottom/lower gate electrodes function as bottom/lower selective gates (BSG). The top/upper gate electrodes function as top/upper selective gates (TSG). Back-End-of Line (BEOL) Metal plays the role of Bit-Lines (BLs). The word lines/gate electrodes between the top/upper selective gate electrodes and the bottom/lower gate electrodes function as word lines (WLs). The intersection of a word line and a semiconductor channel forms a memory cell. WLs and BLs are typically laid perpendicular to each other (e.g., in an X-direction and a Y-direction), and TSGs are laid in a direction perpendicular to both the WLs and BLs (e.g., in a Z-direction.)

BRIEF SUMMARY

Embodiments of three-dimensional memory device architectures and fabrication methods therefore are disclosed herein. The disclosed structures and methods provide numerous benefits, including, but not limited to less parasitic current leakage and greater uniformity when growing epitaxial silicon contacting the NAND memory strings.

In some embodiments, a NAND memory device includes a substrate having one or more first recesses in a first region and one or more second recesses in a second region. A liner layer is disposed over the sidewalls and bottom of the one or more first recesses in the first region and an epitaxially-grown material is formed in the one or more second recesses in the second region. One or more NAND strings are formed over the epitaxially-grown material disposed in the one or more second recesses, and one or more vertical structures are formed over the one or more first recesses in the first region.

In some embodiments, a NAND memory device includes a substrate having a first region and a second region, where the first region includes one or more first recesses and the second region includes one or more second recesses. An insulating material fills the one or more first recesses in the first region of the substrate, and an epitaxially-grown material is formed in the one or more second recesses in the second region. One or more NAND strings are formed over the epitaxially-grown material disposed in the one or more second recesses, and one or more vertical structures are formed over the insulating material in the first region.

In some embodiments, the NAND memory device also includes an alternating conductor/dielectric stack disposed on the substrate.

In some embodiments, the one or more NAND strings extends vertically above the substrate through the alternating conductor/dielectric stack in the second region.

In some embodiments, the one or more vertical structures extends vertically above the substrate through the alternating conductor/dielectric stack.

In some embodiments, the liner layer comprises one or more of Titanium and/or Titanium nitride (TiN), Tantalum nitride (TaN), Aluminum oxide ($Al_2O_3$), Hafnium oxide ($HfO_2$), and Tantalum oxide ($Ta_2O_5$).

In some embodiments the insulating material comprises silicon oxide or silicon nitride or amorphous silicon (a-Si), or any material that inhibits Epi-Si growth upon it.

In some embodiments, the liner layer has a thickness between 5 nm and 20 nm. In some embodiments, the insulating material has a thickness between 0.5 μm and 2 μm.

In some embodiments, the one or more vertical structures includes one or more electrically isolated dummy structures.

In some embodiments, each of the one or more NAND strings and the one or more vertical structures includes an inner semiconductor channel and an outer dielectric layer.

In some embodiments, a method for forming a NAND memory device includes forming one or more first recesses in a first region of a substrate, and forming a liner layer over the sidewalls and bottom of the one or more first recesses. The method also includes filling the one or more first recesses with an insulating material. The method includes forming an alternating sacrificial/dielectric stack on the substrate. The method further includes forming one or more first holes through the alternating sacrificial/dielectric stack, and forming one or more second holes through the alternating sacrificial/dielectric stack and through a portion of the substrate in a second region of the substrate. The one or more first holes is aligned over the one or more first recesses in the first region of the substrate. Forming the one or more second holes forms a second plurality of recesses in the second region of the substrate. The method further includes forming a material in the one or more second recesses. The method also includes forming one or more NAND strings in the one or more second holes and forming one or more vertical structures in the one or more first holes.

In some embodiments, a method for forming a NAND memory device includes forming one or more first recesses in a first region of a substrate, and filling the one or more first recesses with an insulating material. The method includes forming an alternating sacrificial/dielectric stack on the substrate. The method further includes forming a one or more first holes through the alternating sacrificial/dielectric stack and through only a portion of a total thickness of the insulating material in a direction perpendicular with respect to the substrate. The method includes forming one or more second holes through the alternating sacrificial/dielectric stack and through a portion of the substrate in a second region of the substrate. Forming the one or more second holes forms one or more second recesses in the second region of the substrate. The method further includes forming a material in the one or more second recesses. The method also includes forming one or more NAND strings in the one or more second holes and forming one or more vertical structures in the one or more first holes.

In some embodiments, forming the one or more first recesses includes etching the substrate using a reactive ion etch (RIE) process.

In some embodiments, forming the one or more first recesses in the first region of the substrate includes etching the substrate using a reactive ion etch (RIE) process.

In some embodiments, the method further includes polishing a top surface of the substrate after filling the one or more first recesses with the insulating material.

In some embodiments, the method further includes polishing a top surface of the substrate after filling the one or more first recesses in the first region of the substrate with the insulating material.

In some embodiments, forming the liner layer includes depositing the liner layer using a chemical vapor deposition (CVD) technique, atomic layer deposition technique (ALD), or any other method that can deposit a thin, uniform etch stop layer (ESL).

In some embodiments, filling the one or more first recesses with an insulating material includes depositing the insulating material using a chemical vapor deposition (CVD) technique, high density plasma (HDP), spin-on dielectric (SOD), or any method that fills the recesses without creating voids or seams.

In some embodiments, forming the one or more first holes further includes forming the one or more first holes through at least a portion of the insulating material in the first one or more recesses.

In some embodiments, forming the one or more first holes further includes forming the one or more first holes through at least a portion of the insulating material in the first one or more recesses in the first region of the substrate.

In some embodiments, forming the liner layer includes depositing the liner layer to a thickness between 5 nm and 20 nm.

In some embodiments, forming the one or more first recesses in the first region of a substrate includes forming the recess in the substrate having a depth between 0.5 μm and 2 μm.

In some embodiments, forming the one or more NAND strings includes forming a dielectric layer over sidewalls of the one or more second holes, and forming a semiconductor layer that fills a remaining portion of the one or more second holes.

Using the three-dimensional memory device provided by the present disclosure, epitaxial growth of a semiconductor material within openings formed through a stack of alternating dielectric pairs occurs for those openings used to form the NAND memory strings, but is inhibited within the openings not used to form the NAND memory strings. The epitaxial growth is blocked in some of openings by ensuring that the openings do not expose the underlying semiconductor substrate when they are etched. Inhibiting the growth of the epitaxial semiconductor material in openings not used to form the NAND memory strings reduces current leakage in the device and improves the memory cell reliability.

BRIEF DESCRIPTION OF THE DRAWINGS

Aspects of the present disclosure are best understood from the following detailed description when reading with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
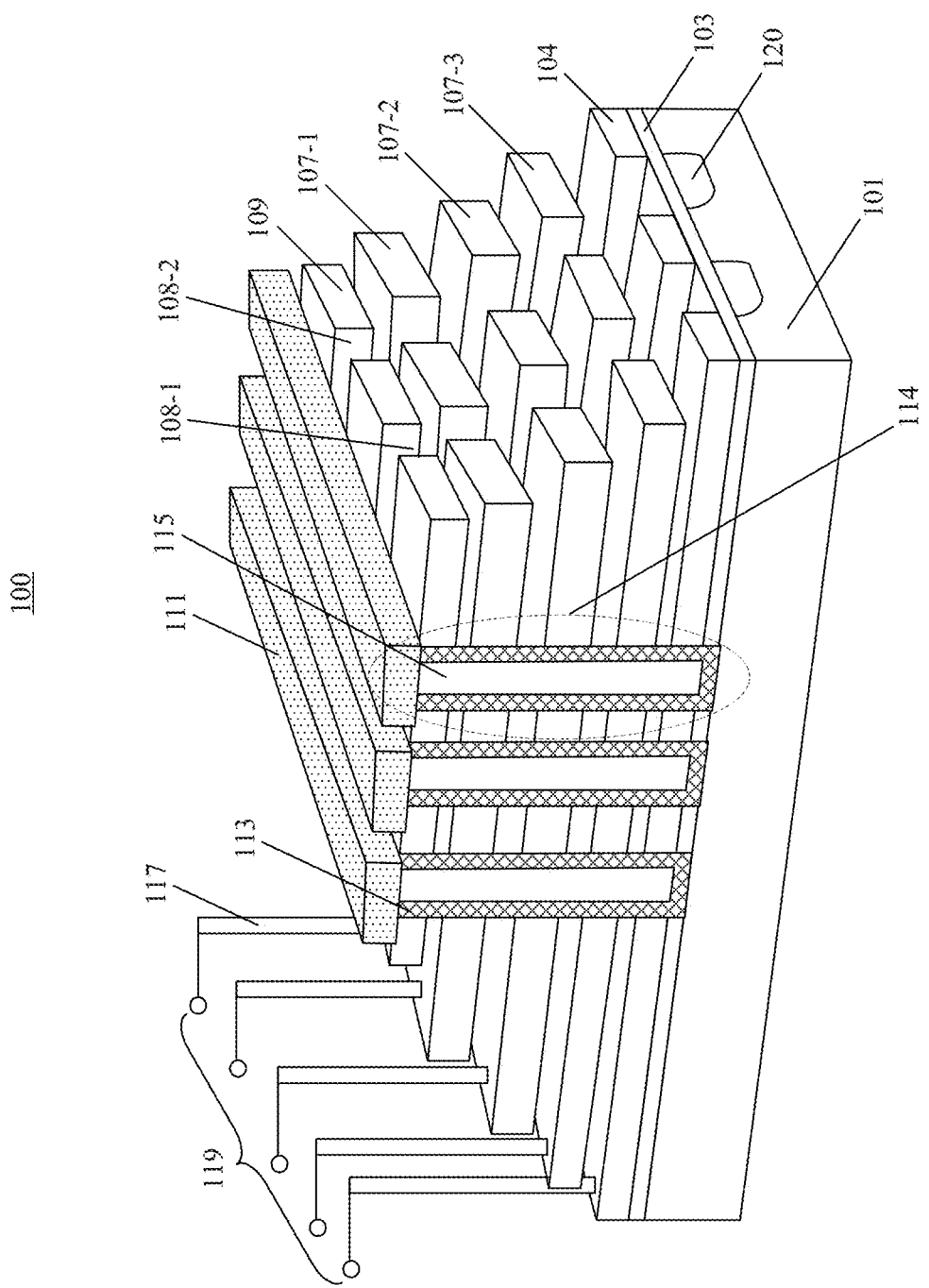
FIG. 1 is an illustration of a three-dimensional memory device.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

FIG. 1 illustrates a portion of a three-dimensional NAND flash memory device 100. The flash memory device 100 includes a substrate 101, an insulating layer 103 over substrate 101, a tier of lower selective gate electrodes 104 over the insulating layer 103, and a plurality of tiers of control gate electrodes 107 stacking on top of bottom selective gate electrodes 104 to form an alternating conductor/dielectric stack. The flash memory device also includes a tier of upper selective gate electrodes 109 over the stack of control gate electrodes 107, doped source line regions 120 in portions of substrate 101 between adjacent lower selective gate electrodes 104, and NAND strings 114 through upper selective gate electrodes 109, control gate electrodes 107, lower selective gate electrodes 104, and insulating layer 103. NAND strings 114 includes a memory film 113 over the inner surface of NAND strings 114 and a core filling film 115 surrounded by memory film 113. The flash memory device 100 further includes a plurality of bit lines 111 connected to NAND strings 114 over upper selective gate electrodes 109 and a plurality of metal interconnects 119 connected to the gate electrodes through a plurality of metal contacts 117. Insulating layers between adjacent tiers of gate electrodes are not shown in FIG. 1 for clarity. The gate electrodes include upper selective gate electrodes 109, control gate electrodes 107 (e.g., also referred to as the word lines), and lower selective gate electrodes 104.

In FIG. 1, for illustrative purposes, three tiers of control gate electrodes 107-1, 107-2, and 107-3 are shown together with one tier of upper selective gate electrodes 109 and one tier of lower selective gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all upper selective gate electrodes 109, control gate electrodes 107, and lower selective gate electrodes 104). Further, the same number of metal interconnects is formed to connect to each metal contact via. In some arrangements, additional metal contacts are formed to connect to other structures beyond the gate electrodes, such as, for example, dummy structures.

When forming NAND strings 114, other vertical structures may also be formed that extend through the tiers of control gate electrodes 107-1, 107-2, and 107-3 down to substrate 101. These other vertical structures may include the same layer structure as NAND strings 114 (e.g., include memory film 113 over the inner surface and core filling film 115 surrounded by memory film 113.) However, the other vertical structures may be electrically isolated from the other components of flash memory device 100 and are referred to herein as "dummy" structures. Other examples of vertical structures include through array contacts (TACs) that may be used to make electrical connection with components above and/or below the tiers of gate electrodes. These other vertical structures are not illustrated in FIG. 1 for clarity, but are discussed in more detail with reference to later figures.

For illustrative purposes, similar or same parts in a three-dimensional NAND device are labeled using same element numbers. However, element numbers are merely used to distinguish relevant parts in the Detailed Description and do not indicate any similarity or difference in functionalities, compositions, or locations. The structures 200-1300 illustrated in FIG. 2 to FIG. 13 are each part of a three-dimensional NAND memory device. Other parts of the memory device are not shown for ease of description. Although using a three-dimensional NAND device as an example, in various applications and designs, the disclosed structure can also be applied in similar or different semiconductor devices to, e.g., reduce the number of metal connections or wiring. The specific application of the disclosed structure should not be limited by the embodiments of the present disclosure. For illustrative purposes, word lines and gate electrodes are used interchangeably to describe the present disclosure.

FIGS. 2-8 illustrate top and side views of various fabrication stages of an example NAND memory device, according to some embodiments. FIGS. 9-13 illustrate top and side views of various fabrication stages of another example of a NAND memory device, according to some embodiments. For each stage of the fabrication, the figure denoted with an 'A' represents the top view of the current fabrication stage and the figure denoted with a 'B' represents a cross-section view of the same fabrication stage.

Figure 2A:
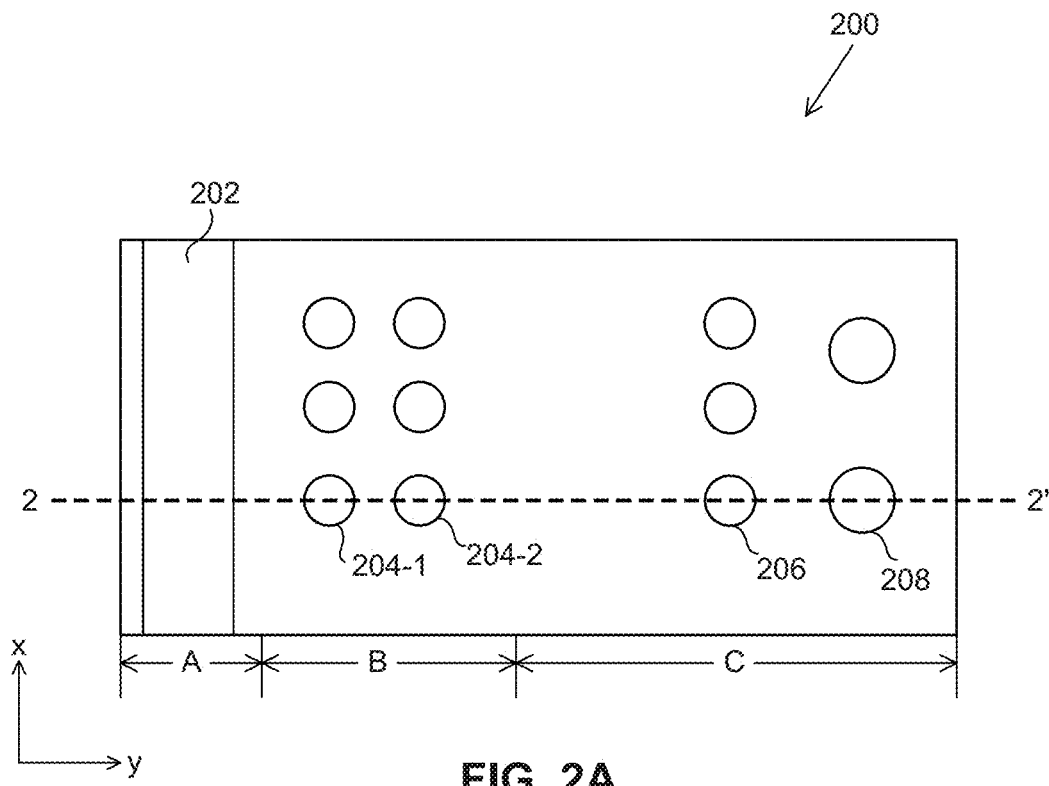
FIGS. 2A and 2B illustrate top and side views of a three-dimensional memory structure at a stage of an exemplary fabrication process, according to some embodiments.
Figure 2B:
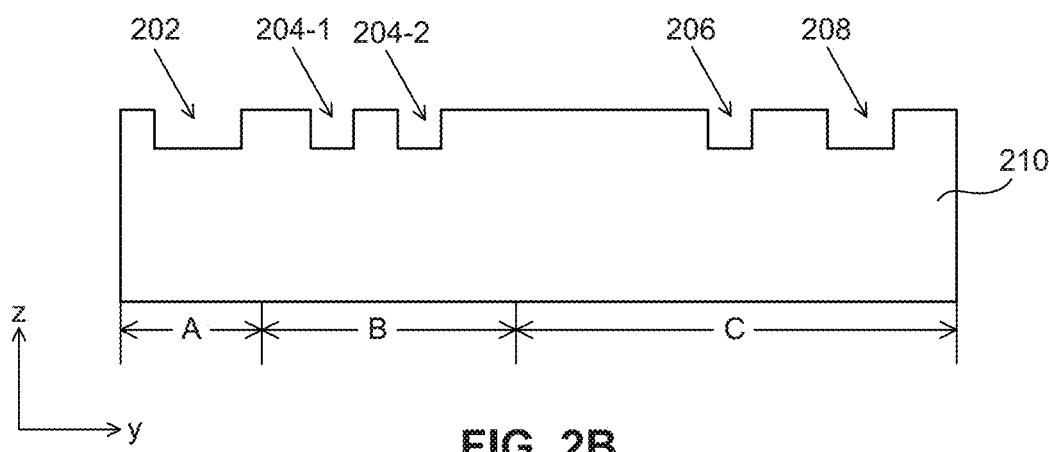

FIGS. 2A and 2B illustrate an exemplary structure 200 for forming a three-dimensional memory structure, according to some embodiments. FIG. 2A is a top view of structure 200, and FIG. 2B is a cross-sectional view of structure 200 along the 2-2' direction. In some embodiments, structure 200 includes a base substrate 210. Base substrate 210 can provide a platform for forming subsequent structures. Such subsequent structures are formed on a front (e.g., top) surface of structure 200. And such subsequent structures are said to be formed in a vertical direction (e.g., perpendicular to the front and back surfaces.) In FIGS. 2A and 2B, and for all subsequent illustrated structures, the X and Y directions are along a plane parallel to the front and back surfaces of structure 200, while the Z direction is in a direction perpendicular to the front and back surfaces of structure 200.

In some embodiments, base substrate 210 includes any suitable material for forming the three-dimensional memory device. For example, base substrate 210 can include silicon, silicon germanium, silicon carbide, silicon on insulator (SOI), germanium on insulator (GOI), glass, gallium nitride, gallium arsenide, and/or other suitable III-V compound.

For illustrative purposes, structure 200 (e.g., or base substrate 210) is divided into three regions, i.e., regions A,
B, and C. In the subsequent fabrication of the three-dimensional memory structure, word lines (gate electrodes) are formed over regions B (e.g., stair-step region) and C (e.g., core array region) along a horizontal direction (e.g., y-axis) substantially parallel to the top surface of base substrate 210. Semiconductor channels (e.g., also known as memory strings or NAND strings) are formed substantially over region C, and connection portions that conductively connect word lines are substantially formed over region B. Region A may be used to represent a scribe line where substrate 210 is diced or cleaved to release individual memory chips. It should be noted that, regions A, B, and C are presented for ease of description only, and are not intended to indicate physical division of structure 200 or dimensions of structure 200.

According to some embodiments, a first plurality of recesses 204-1 and 204-2 are formed in a first region (e.g., region B) of substrate 210. Other recesses may also be formed in a second region (e.g., region C), such as recess 206 and recess 208. The scribe line region (region A) may include a recess 202. Recess 202 may be used to form a shallow trench isolation (STI) structure within substrate 210.

As illustrated in FIG. 2A, each of first plurality of recesses 204-1 and 204-2, and other recesses 206 and 208 may have a substantially circular cross-section. An array of such recesses may be formed in each of regions B and/or C in substrate 210. According to some embodiments, each of recesses 204-1, 204-2, 206, and 208 indicate locations where future dummy structures and other TAC structures will be formed. The memory NAND strings will be formed elsewhere in region C as will be discussed in more detail herein. In one example, each of recesses 204-1, 204-2, and 206 are used to provide locations of future dummy structures while recess 208 has a larger diameter and is used to provide a location of a future TAC.

Any of the recesses discussed may be formed using conventional lithography techniques as would be understood to a person skilled in the relevant art. Such conventional techniques include depositing a masking layer, patterning the masking layer using a photoresist, and etching the exposed substrate to form each of the recesses. The etching may be performed using well known wet or dry techniques, such as reactive ion etching (RIE) or etching with potassium hydroxide (KOH), to name a few examples.

Figure 3A:
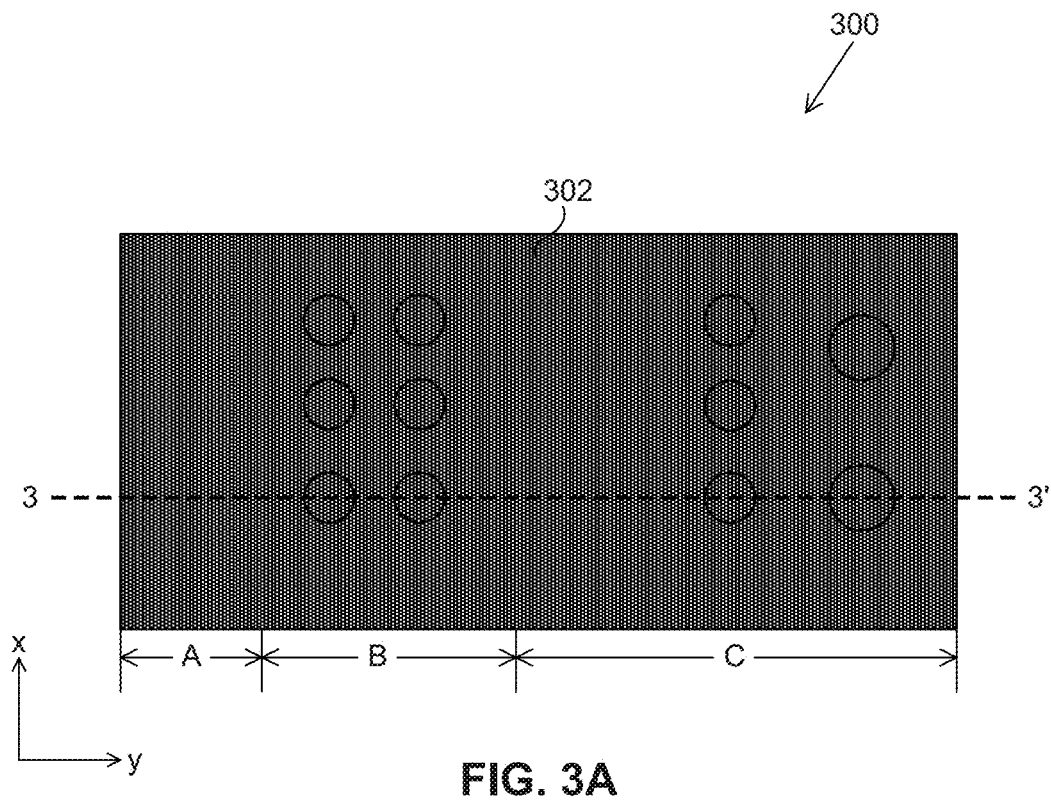
FIGS. 3A and 3B illustrate top and side views of a three-dimensional memory structure at a stage of an exemplary fabrication process, according to some embodiments.
Figure 3B:
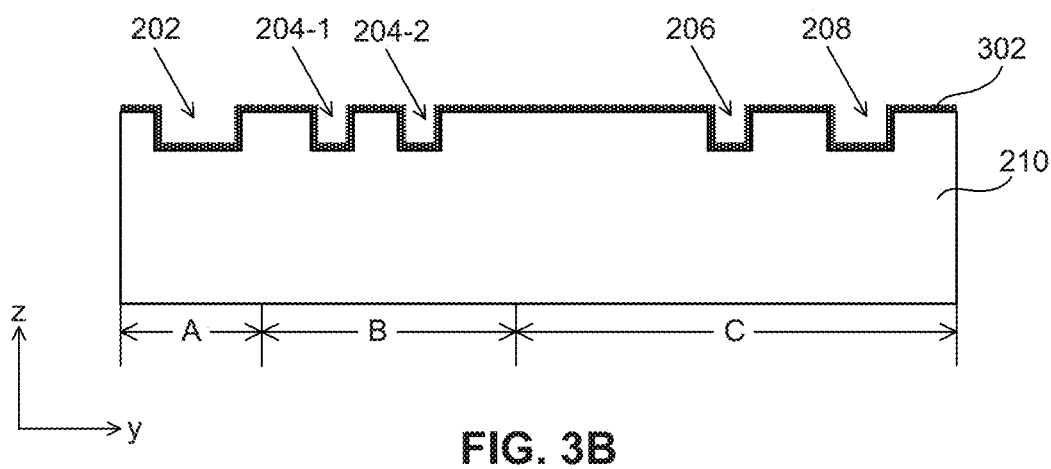

FIGS. 3A and 3B illustrate an exemplary structure 300 for forming the three-dimensional memory device, according to some embodiments. FIG. 3A is a top view of structure 300, and FIG. 3B is a cross-sectional view of structure 300 along the 3-3' direction. A blanket liner layer 302 is deposited over substrate 210, according to an embodiment. Liner layer 302 covers the sidewalls and bottom surfaces of each of recesses 202, 204-1, 204-2, 206, and 208. Liner layer 302 may have a thickness between about 2 nm and about 20 nm and may include a dielectric material such as TiN, TaN, $Al_2O_3$, $HfO_2$, or $Ta_2O_5$.

Liner layer 302 may be deposited using conventional deposition techniques. For example, liner layer 302 may be deposited using chemical vapor deposition (CVD). Example CVD techniques include plasma-enhanced CVD (PECVD), low pressure CVD (LPCVD), and atomic layer deposition (ALD). Liner layer 302 may also be deposited using high density plasma (HDP).

Figure 4A:
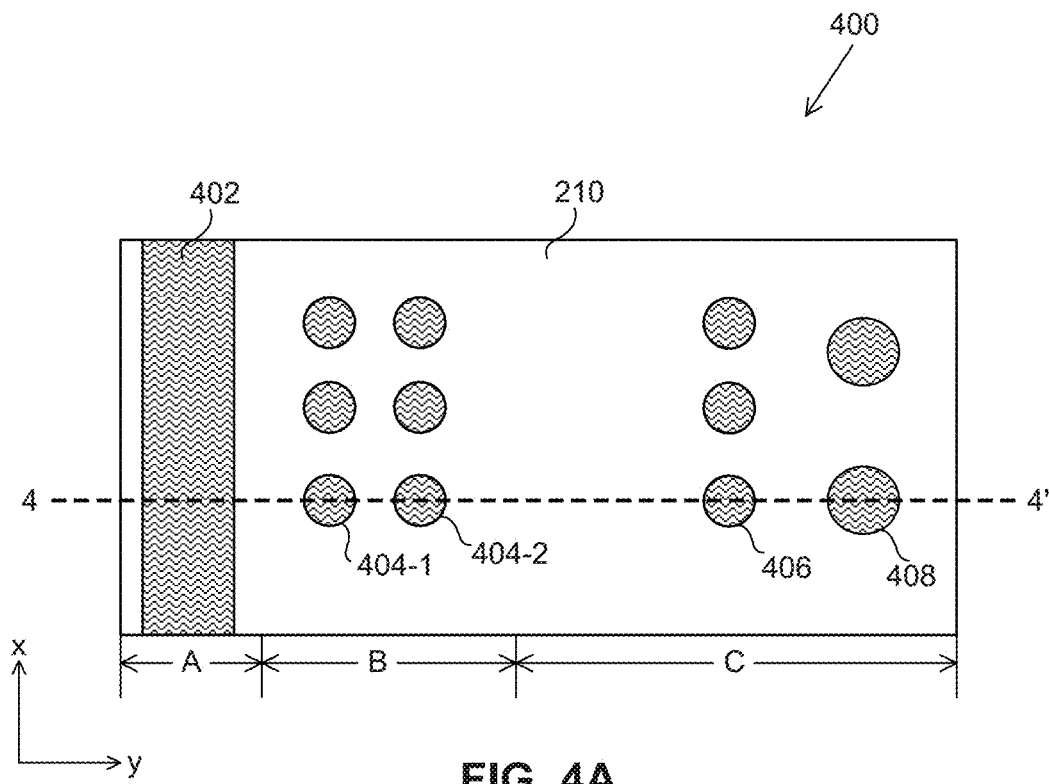
FIGS. 4A and 4B illustrate top and side views of a three-dimensional memory structure at a stage of an exemplary fabrication process, according to some embodiments.
Figure 4B:
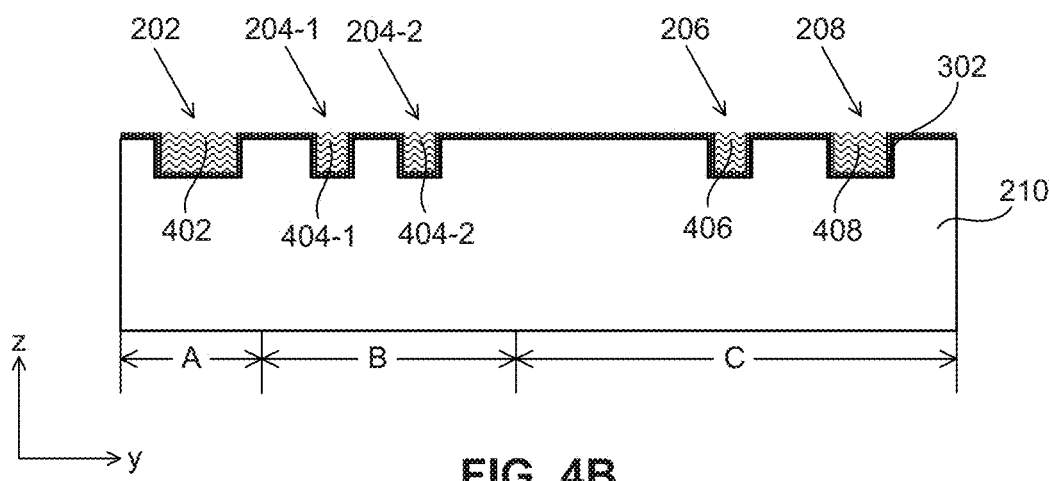

FIGS. 4A and 4B illustrate an exemplary structure 400 for forming the three-dimensional memory device, according to some embodiments. FIG. 4A is a top view of structure 400, and FIG. 4B is a cross-sectional view of structure 400 along the 4-4' direction. Each of recesses 202, 204-1, 204-2, 206, and 208 is substantially filled with an insulating material 402, 404-1, 404-2, 406, and 408, respectively, according to some embodiments. The insulating material may be silicon dioxide or silicon nitride. According to some embodiments, the material of liner layer 302 is chosen to have a very high etch selectivity with the material chosen for insulating material 402, 404-1, 404-2, 406, and 408. For example, the insulating material 402, 404-1, 404-2, 406, and 408 may have anywhere between a 100:1 and a 500:1 etch rate selectivity ratio to liner layer 302. In some embodiments, recess 202 is used as an alignment mark to aid with aligning in subsequent fabrication processes of the memory device.

Insulating material 402, 404-1, 404-2, 406, and 408 may be deposited using conventional deposition techniques. For example, insulating material 402, 404-1, 404-2, 406, and 408 may be deposited using CVD. Example CVD techniques include plasma-enhanced CVD (PECVD), low pressure CVD (LPCVD), and ALD. Insulating material 402, 404-1, 404-2, 406, and 408 may also be deposited using HDP or a spin-on dielectric (SOD). According to an embodiment, following the deposition of insulating material 402, 404-1, 404-2, 406, and 408, a top surface of substrate 210 is polished to form a planar surface across the top of substrate 210. The polishing also removes liner layer 302 from the top surface of substrate 210, such that, following the polishing, liner layer 302 exists only along the sidewalls and bottom surface of each of recesses 202, 204-1, 204-2, 206, and 208. The polishing may be performed using chemical mechanical polishing (CMP), as one example.

Figure 5A:
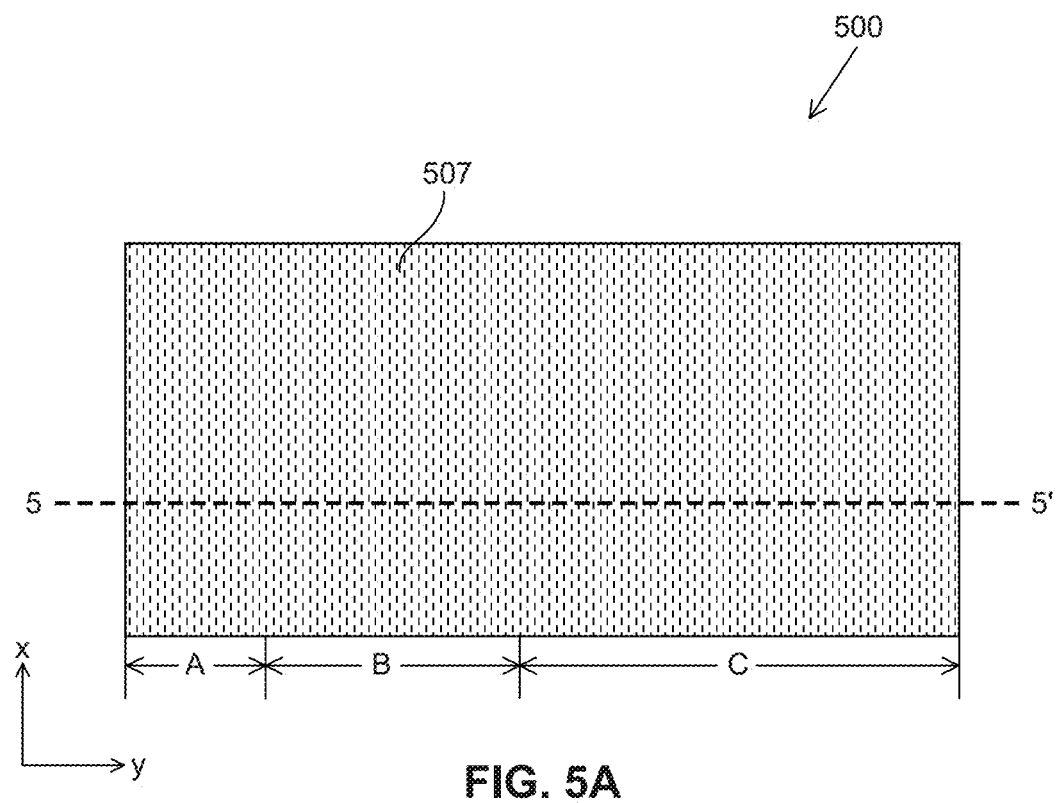
FIGS. 5A and 5B illustrate top and side views of a three-dimensional memory structure at a stage of an exemplary fabrication process, according to some embodiments.
Figure 5B:
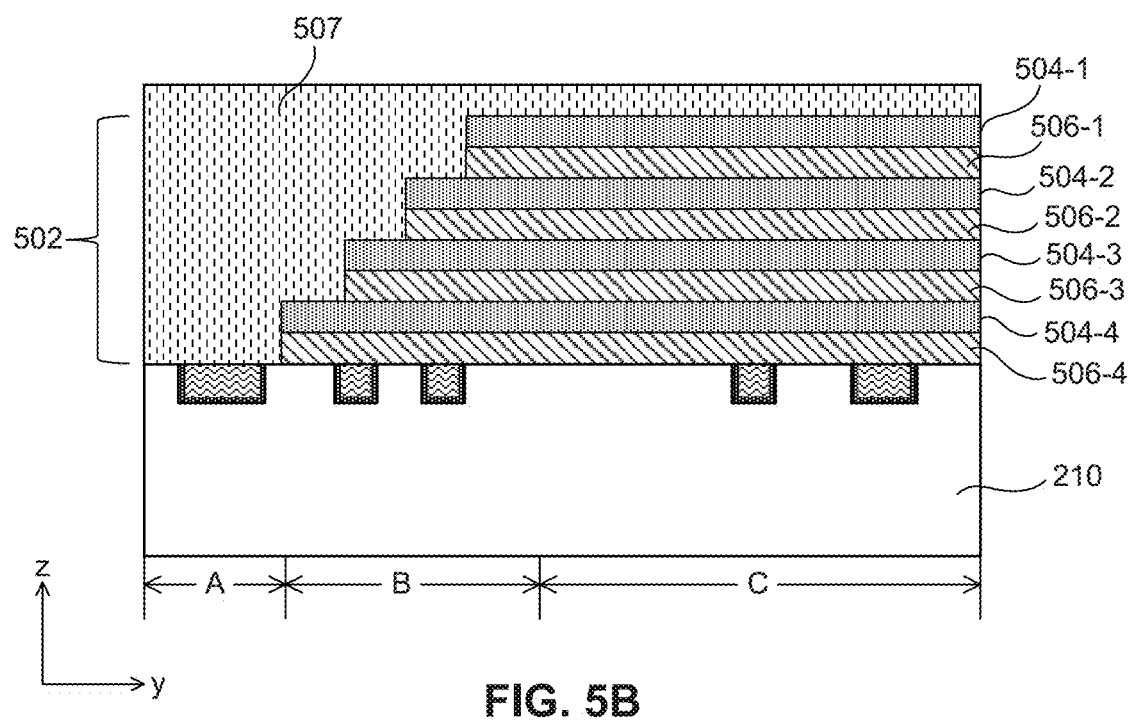

FIGS. 5A and 5B illustrate structure 500 for forming the three-dimensional memory device, according to some embodiments. FIG. 5A is a top view of structure 500, and FIG. 5B is a cross-sectional view of structure 500 along the 5-5' direction. A layer stack 502 of alternating sacrificial/dielectric layers is formed over substrate 210, according to an embodiment. The layer stack 502 includes a portion over region C of substrate 210 having sacrificial layers 504-1 to 504-4 alternating with dielectric layers 506-1 to 506-4. The formation of layer stack 502 may involve depositing sacrificial layers 504-1 to 504-4 to each have the same thickness or to have different thicknesses. Example thicknesses of sacrificial layers 504-1 to 504-4 may range from 20 nm to 500 nm. Similarly, dielectric layers 506-1 to 506-4 can each have the same thickness or have different thicknesses. Example thicknesses of dielectric layers 506-1 to 506-4 may range from 20 nm to 500 nm. Another dielectric material 507 is deposited over layer stack 502. Dielectric material 507 has the same material composition of dielectric layers 506-1 to 506-4, according to some embodiments.

The dielectric material of sacrificial layers 504-1 to 504-4 is different from the dielectric material of dielectric layers 506-1 to 506-4, according to an embodiment. For example, each of sacrificial layers 504-1 to 504-4 may be silicon nitride while each of dielectric layers 506-1 to 506-4 may be silicon dioxide. Other example materials for each of sacrificial layers 504-1 to 504-4 include poly-crystalline silicon, poly-crystalline germanium, and poly-crystalline germanium-silicon. The dielectric materials used for any of dielectric layers 506-1 to 506-4 or sacrificial layers 504-1 to 504-4 may include silicon oxide, silicon nitride, silicon oxynitride, or any combination thereof. Although only four alternating dielectric pairs are illustrated in layer stack 502, it should be understood that this is for illustrative purposes only and that any number of dielectric pairs may be included in layer stack 502.

Layer stack 502 includes a portion over region B of substrate 210 having a staircase structure where each of sacrificial layers 504-1 to 504-4 and dielectric layers 506-1 to 506-4 terminate at a different length in the horizontal 'y' direction within region B. This staircase structure allows for electrical contact to connect each of the word lines of the memory device.

Figure 6A:
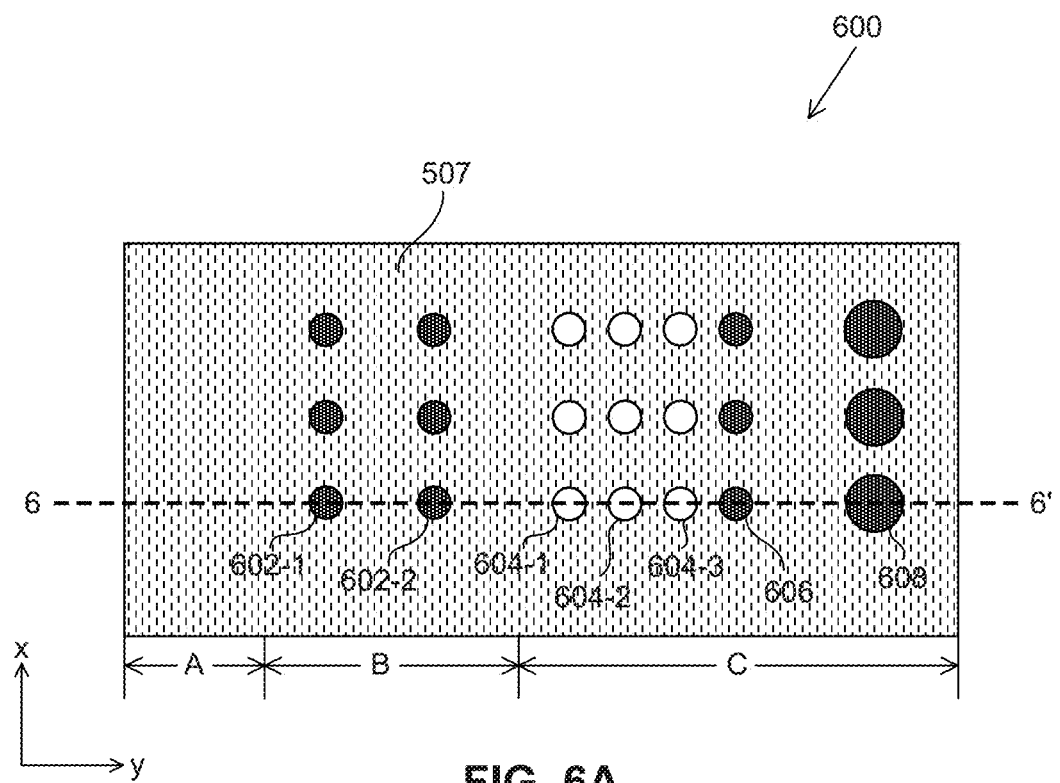
FIGS. 6A and 6B illustrate top and side views of a three-dimensional memory structure at a stage of an exemplary fabrication process, according to some embodiments.
Figure 6B:
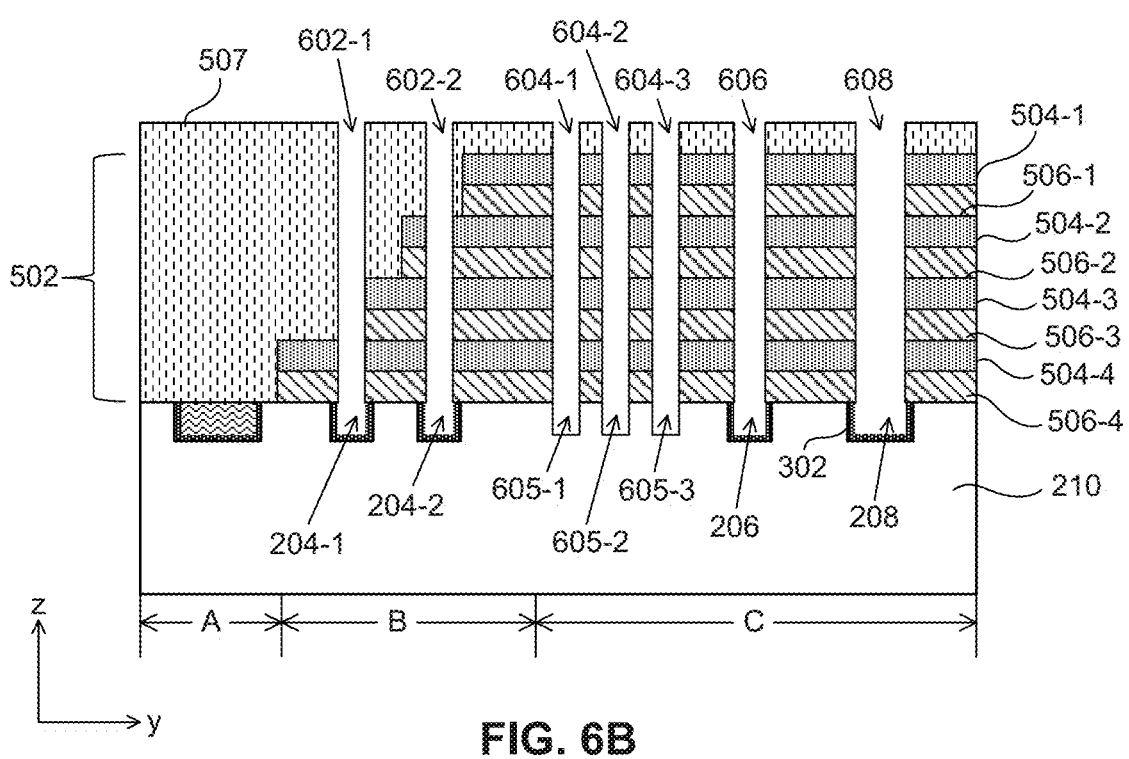

FIGS. 6A and 6B illustrate structure 600 for forming the three-dimensional memory device, according to some embodiments. FIG. 6A is a top view of structure 600, and FIG. 6B is a cross-sectional view of structure 600 along the 6-6' direction. According to an embodiment, a first plurality of holes 602-1 and 602-2 are etched through layer stack 502 and aligned over recesses 204-1 and 204-2, respectively, in a first region (e.g., region B) of substrate 210. Similarly, other holes 606 and 608 may be etched through layer stack 502 and aligned over recesses 206 and 208, respectively, within a second region (e.g., region C) of substrate 210.

Each of holes 602-1, 602-2, 606, and 608 may be etched through layer stack 502 using an RIE process. Additionally, the etching may include etching through at least a portion of the insulating material disposed in each of recesses 204-1, 204-2, 206, and 208. According to an embodiment, the process of etching holes 602-1, 602-2, 606, and 608 does not etch into the material of substrate 210 due to the presence of liner layer 302. A diameter of holes 602-1, 602-2, and 606 may be between about 100 nm and 200 nm.

Holes 604-1 to 604-3 may also be etched through layer stack 502 within a second region (e.g., region C) of substrate 210. According to an embodiment, holes 604-1 to 604-3 are etched down into the material of substrate 210 such that recesses 605-1 to 605-3 are respectively formed within substrate 210. Holes 604-1 to 604-3 provide the space for the memory NAND strings to be formed within the core memory region (e.g., region C) of substrate 210, according to some embodiments. A diameter of holes 604-1 to 604-3 may be between about 100 nm and 200 nm, for example.

As can be seen from the top view of structure 600, an array of holes may be formed through layer stack 502 in both regions B and C of substrate 210. It should be understood that any number of holes may be formed through layer stack 502 in any pattern, as viewed from above.

Figure 7A:
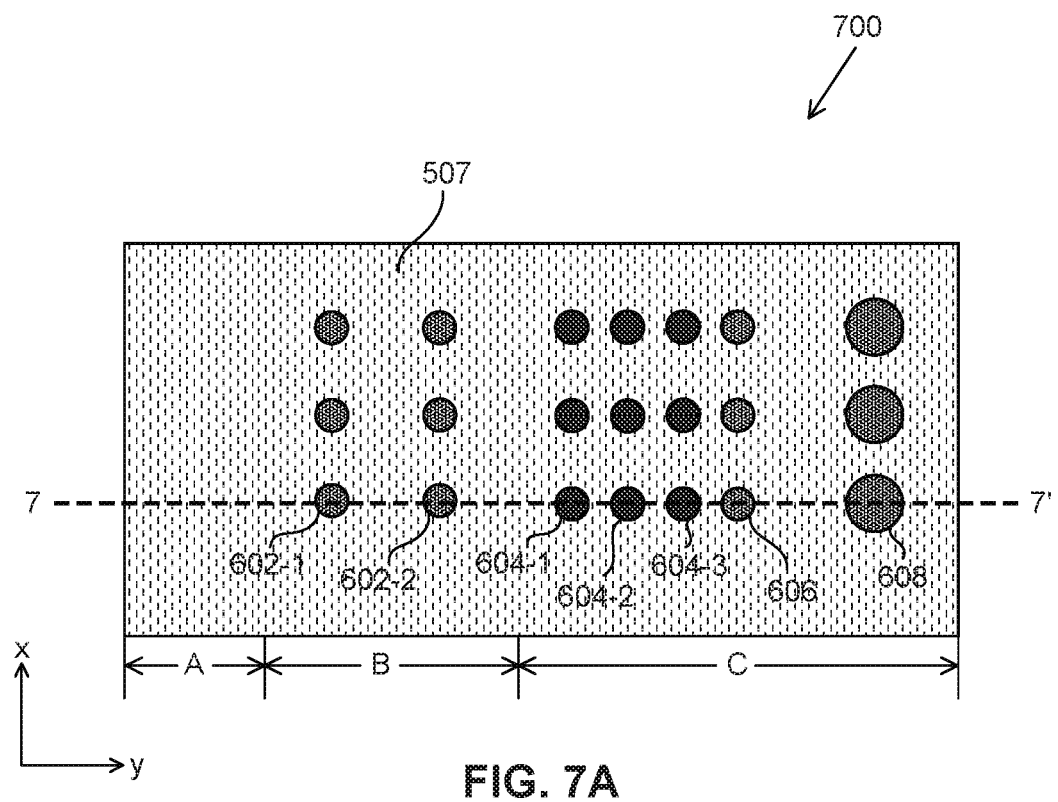
FIGS. 7A and 7B illustrate top and side views of a three-dimensional memory structure at a stage of an exemplary fabrication process, according to some embodiments.
Figure 7B:
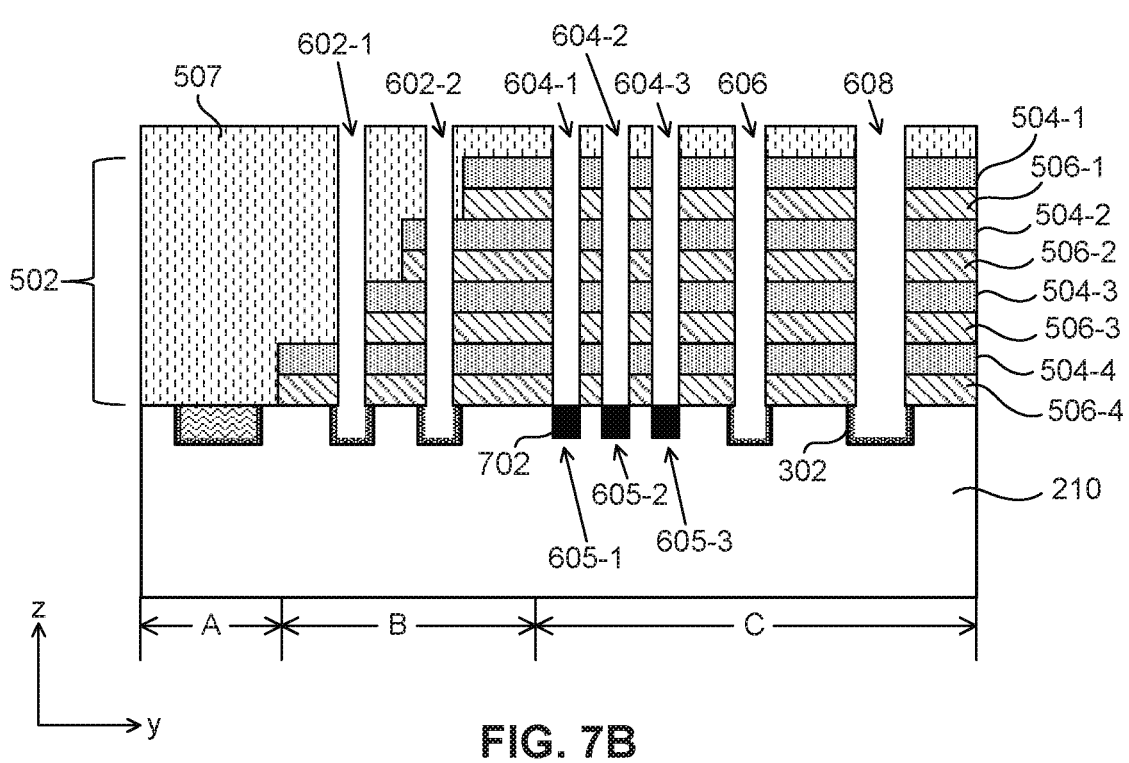

FIGS. 7A and 7B illustrate structure 700 for forming the three-dimensional memory device, according to some embodiments. FIG. 7A is a top view of structure 700, and FIG. 7B is a cross-sectional view of structure 700 along the 7-7' direction. According to some embodiments, an epitaxially grown material 702 is formed within each of recesses 605-1 to 605-3 at the bottom of holes 604-1 to 604-3. Epitaxially grown material 702 may be any semiconductor material that typically matches the semiconductor material of substrate 210. For example, when substrate 210 is silicon, epitaxially grown material 702 may be epitaxially grown silicon.

According to some embodiments, epitaxially grown material 702 does not form within any of holes 602-1, 602-2, 606, and 608. This is because holes 602-1, 602-2, 606, and 608 did not expose any part of substrate 210 due to the presence of the pre-etched recesses and liner layer 302. Without any exposed semiconductor substrate, there is no seed material present to initiate growth of the epitaxially grown material. By limiting growth of material 702 to only those holes that will ultimately include the NAND memory strings, current leakage through the memory device is reduced and cell reliability is increased.

Figure 8A:
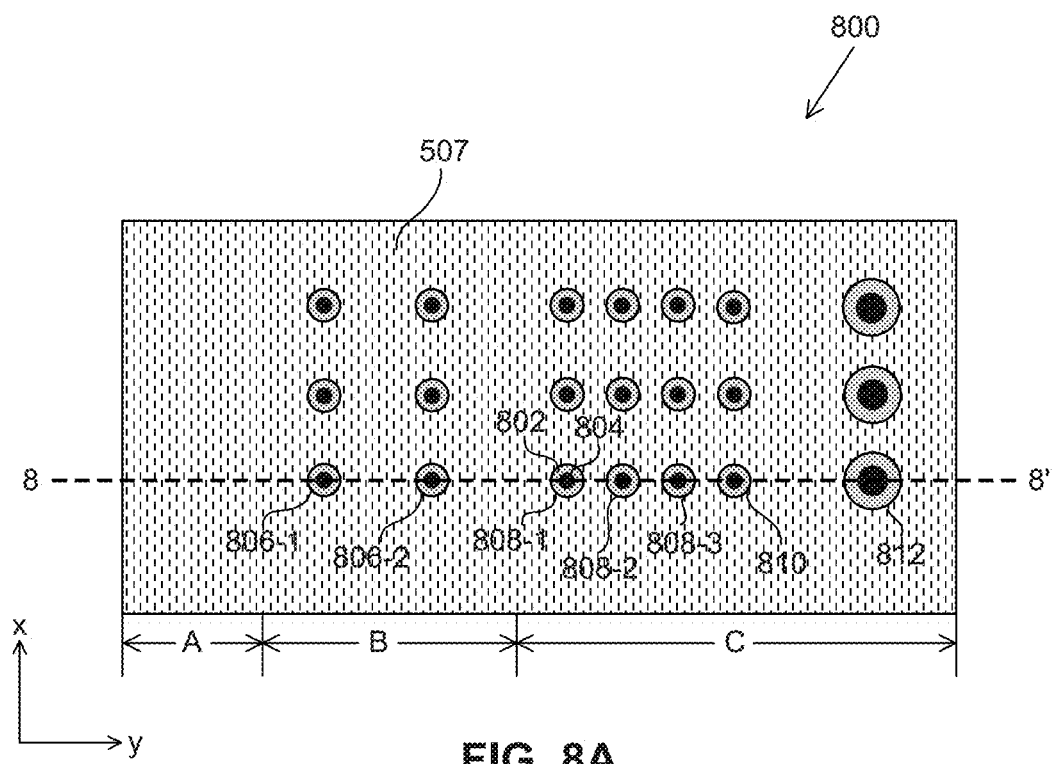
FIGS. 8A and 8B illustrate top and side views of a three-dimensional memory structure at a stage of an exemplary fabrication process, according to some embodiments.
Figure 8B:
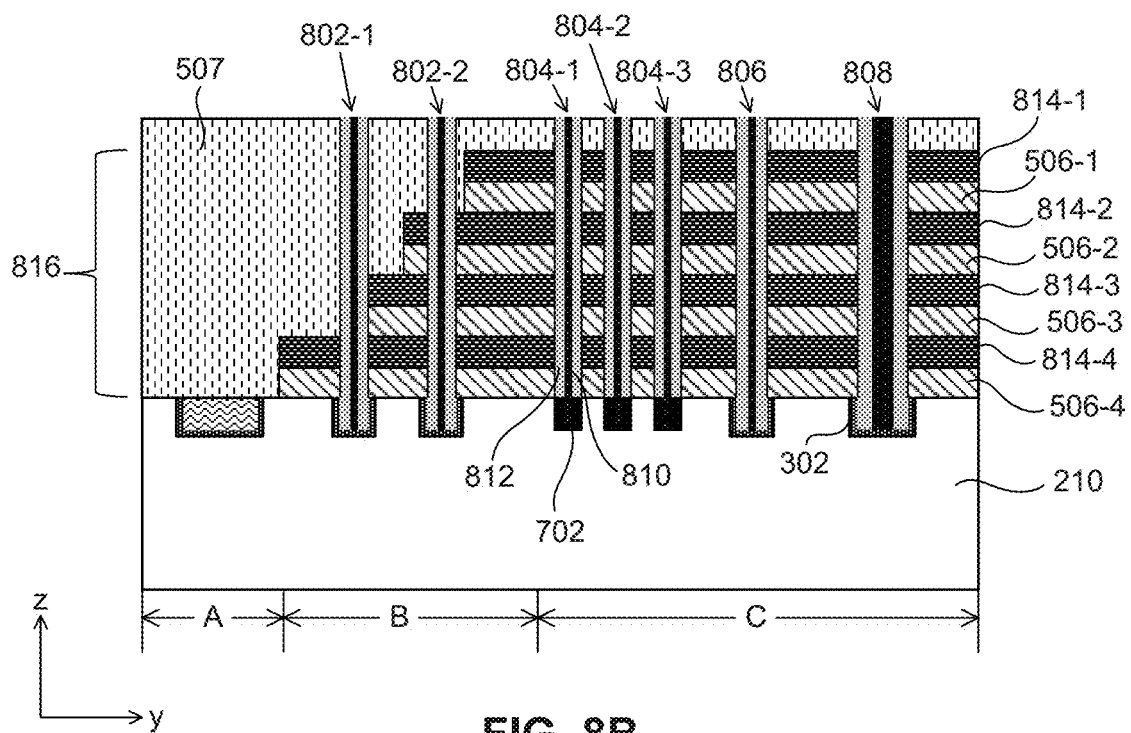

FIGS. 8A and 8B illustrate structure 800 for forming the three-dimensional memory device, according to some embodiments. FIG. 8A is a top view of structure 800, and FIG. 8B is a cross-sectional view of structure 800 along the 8-8' direction. According to some embodiments, vertical structures 802-1, 802-2, 806, and 808 are formed within holes 602-1, 602-2, 606, and 608, respectively. Vertical structures 802-1, 802-2, and 806 may be dummy structures that are electrically isolated from any other portions of the memory device. For example, vertical structures 802-1, 802-2, and 806 may be electrically isolated from all gate electrodes represented by conductor layers 814-1 to 814-4. Vertical structure 808 may be a TAC that makes electrical contact with a lowest or highest conductor layer 504. Additionally, NAND strings 804-1 to 804-3 are formed over epitaxially grown material 702 within holes 604-1 to 604-3, respectively. Each of NAND strings 804-1 to 804-3 and the word lines (e.g., conductor layers 814-1 to 814-4) can form memory cells, e.g., reading, programming, and erasing, of the three-dimensional memory device.

Each NAND string 804 can substantially have a shape of a pillar along the z-axis and can include a plurality of layers surrounding one another. For example, each NAND string 804 can include a semiconductor channel 810 and a dielectric layer 812 (also known as "memory film"). In some embodiments, semiconductor channel 810 includes silicon, such as amorphous silicon, polysilicon, or single crystalline silicon. In some embodiments, dielectric layer 812 is a composite layer including a tunneling layer, a storage layer (also known as "charge trap/storage layer"), and a blocking layer. Semiconductor channel 810, the tunneling layer, the storage layer, and the blocking layer are arranged along a direction from the center toward the outer surface of the pillar in this order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, dielectric layer 812 includes silicon oxide/silicon nitride/silicon oxide (ONO) dielectrics (e.g., a tunneling layer including silicon oxide, a storage layer including silicon nitride, and a blocking layer including silicon oxide).

According to an embodiment, sacrificial layers 504-1 to 504-4 of layer stack 502 are removed and replaced with conductor layers 814-1 to 814-4 to form an alternating dielectric/conductor stack 816. Sacrificial layers 504-1 to 504-4 can be removed by a suitable etching process, e.g., an isotropic dry etch or a wet etch. The etching process can have sufficiently high etching selectivity of the material of sacrificial layers 504-1 to 504-4 over the materials of other parts of structure 800, such that the etching process can have minimal impact on the other parts of structure 800. In some embodiments, sacrificial layers 504-1 to 504-4 include silicon nitride and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10 V. In some embodiments, sacrificial layers 504-1 to 504-4 include silicon nitride and the etchant of the wet etch includes phosphoric acid.

Conductor layers 814-1 to 814-4 can include conductor materials including, but not limited to, W, Co, Cu, Al, doped silicon, silicides, or any combination thereof. Each of conductor layers 814-1 to 814-4 can be deposited into the regions left behind by the removal of sacrificial layers 504-1 to 504-4 using a suitable deposition method such as CVD, sputtering, MOCVD, and/or ALD.

Each of vertical structures 802-1, 802-2, 806, and 808 includes the same layer structure as NAND strings 804-1 to 804-3, according to some embodiments. For example, each of vertical structures 802-1, 802-2, 806, and 808 includes semiconductor channel 810 and dielectric layer 812, as described above. Vertical structures 802-1, 802-2, and 806 may be provided as dummy structures to assist in the fabrication of conductor layers 814-1 to 814-4. The dummy structures may be provided to reduce loading effects during the RIE etching process and yield more highly uniform etch rates through the various holes being etched across substrate 210.

Figure 9A:
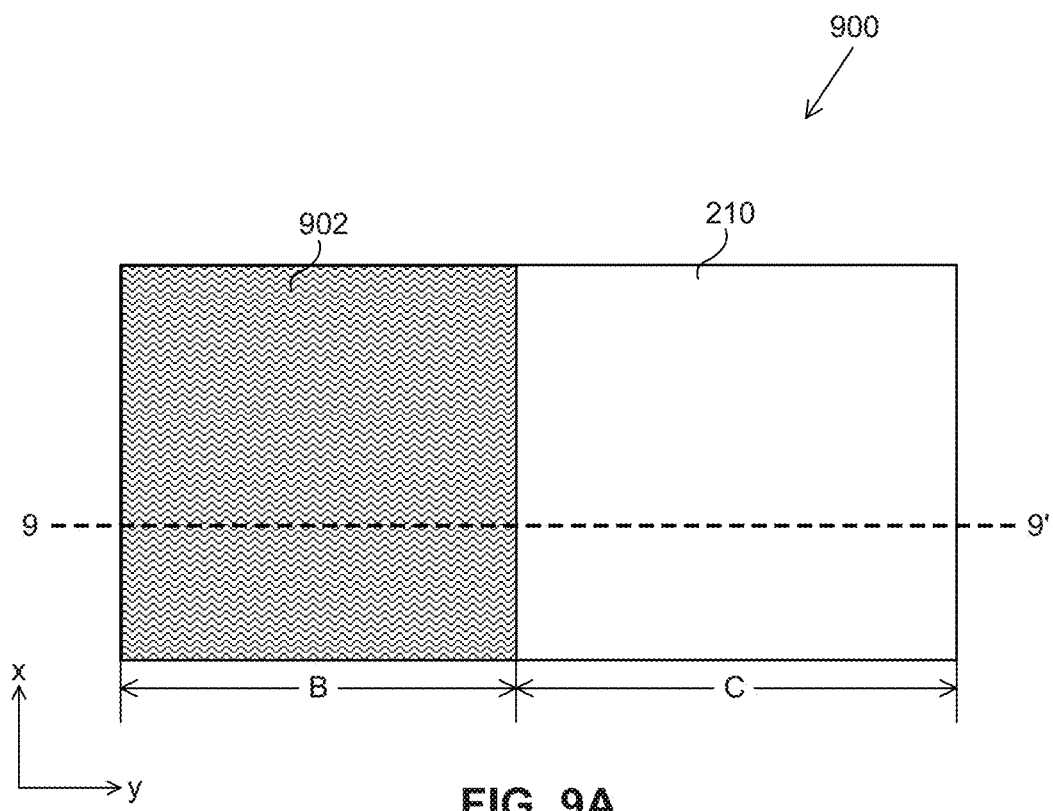
FIGS. 9A and 9B illustrate top and side views of another three-dimensional memory structure at a stage of an exemplary fabrication process, according to some embodiments.
Figure 9B:
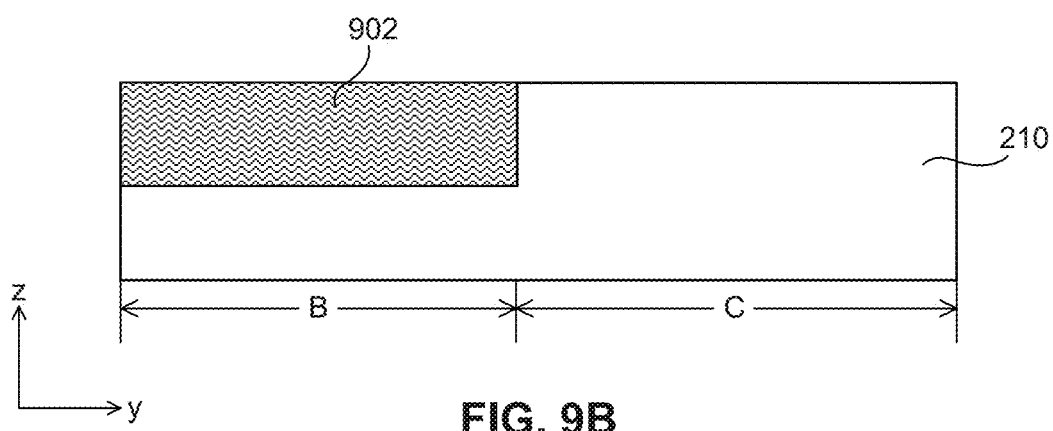

FIGS. 9A and 9B illustrate structure 900 for forming another three-dimensional memory device, according to some embodiments. FIG. 9A is a top view of structure 900, and FIG. 9B is a cross-sectional view of structure 900 along the 9-9' direction. For illustrative purposes, structure 900 (e.g., or base substrate 210) is divided into two regions, i.e., regions B and C. These regions may be similar to regions B and C described with reference to the three-dimensional memory device illustrated in FIGS. 2-8. In the subsequent fabrication of the three-dimensional memory structure, TAC structures are formed in region B. Semiconductor channels (e.g., also known as memory strings or NAND strings) are formed in region C. In some embodiments, other vertical structures, such as dummy structures, may be formed in either region B or region C. It should be noted that, regions B and C are presented for ease of description only, and are not intended to indicate physical division of structure 900 or dimensions of structure 900.

According to some embodiments, a recess is formed within region B of substrate 210 and is subsequently filled with an insulating material 902. In some embodiments, an etch-stop liner layer is deposited first, followed by insulating material 902. The etch stop liner layer 302 may be TiN, TaN, $Al_2O_3$, $HfO_2$, or $Ta_2O_5$. The recess may be formed using conventional lithography techniques as would be understood to a person skilled in the relevant art. Such conventional techniques include depositing a mask layer, patterning the mask layer using a photoresist, and etching the exposed substrate to form the recess. The etching may be performed using well known wet or dry techniques, such as reactive ion etching (RIE) or etching with potassium hydroxide (KOH), to name a few examples.

The insulating material may be silicon oxide or silicon nitride. Insulating material 902 may be deposited using conventional deposition techniques. For example, insulating material 902 may be deposited using CVD. Example CVD techniques include PECVD, LPCVD, and ALD. Insulating material 902 may also be deposited using HDP. Insulating material 902 may have a thickness between about 0.5 μm and about 2 μm.

According to an embodiment, following the deposition of insulating material 902, a top surface of substrate 210 is polished to form a planar surface across the top of substrate 210. The polishing may be performed using chemical mechanical polishing (CMP) and forms a planar top surface where the semiconductor material of substrate 210 is exposed on the top surface in region C and insulating material 902 is exposed on the top surface in region B.

Figure 10A:
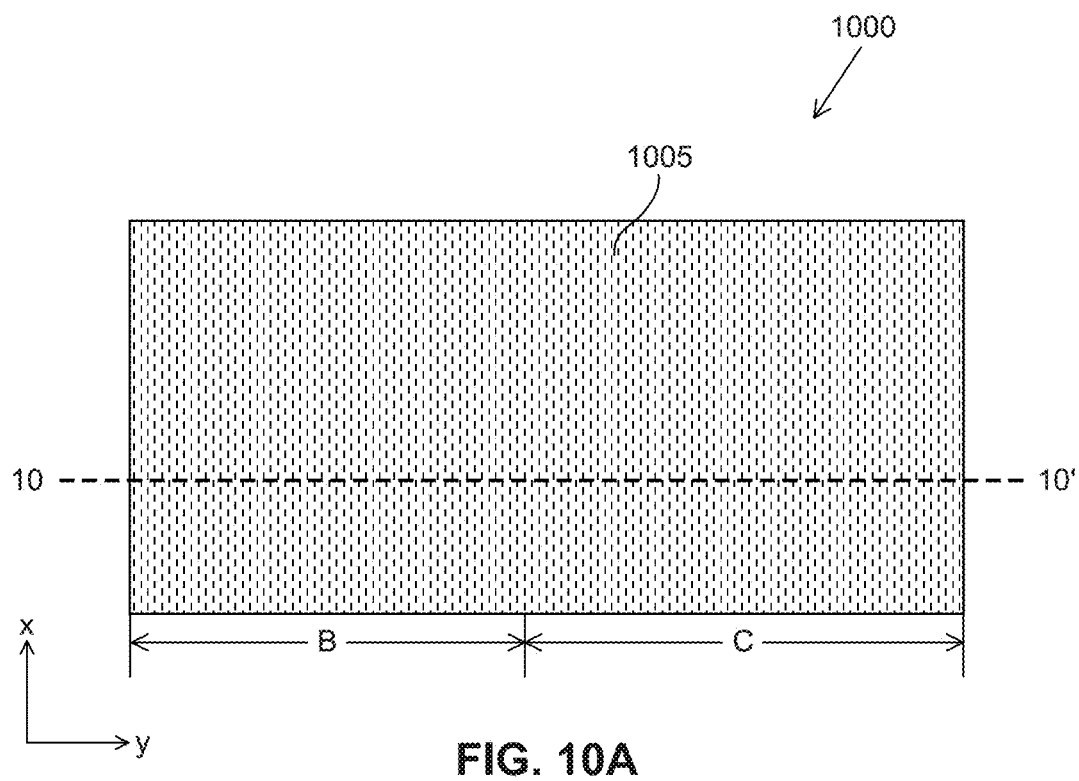
FIGS. 10A and 10B illustrate top and side views of another three-dimensional memory structure at a stage of an exemplary fabrication process, according to some embodiments.
Figure 10B:
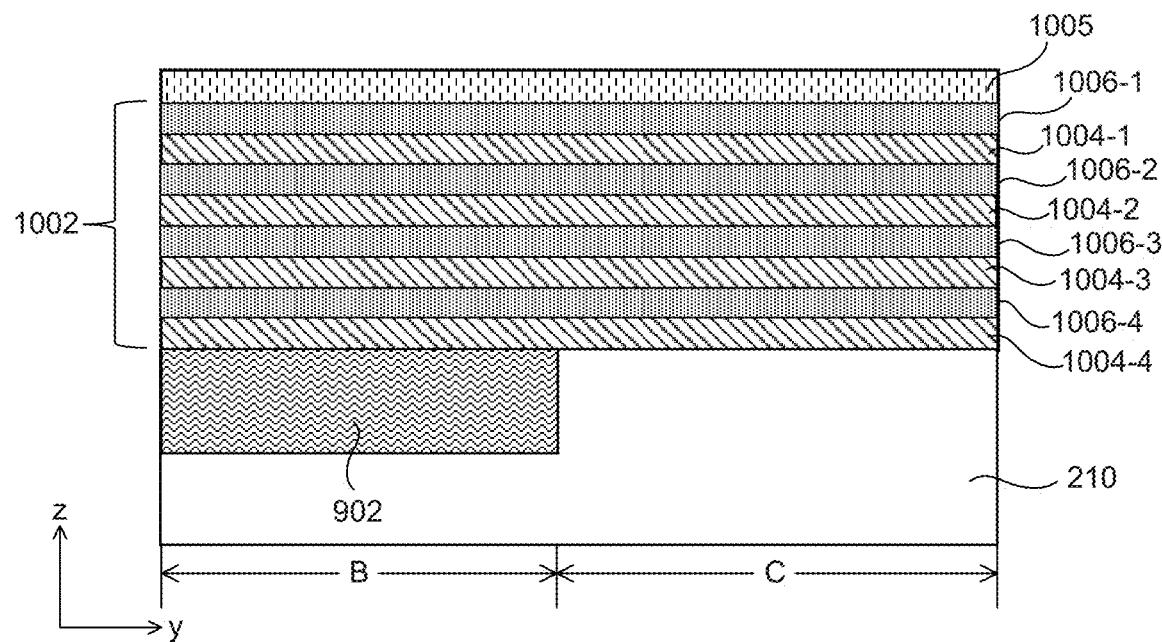

FIGS. 10A and 10B illustrate structure 1000 for forming another three-dimensional memory device, according to some embodiments. FIG. 10A is a top view of structure 1000, and FIG. 10B is a cross-sectional view of structure 1000 along the 10-10' direction.

A layer stack 1002 of alternating sacrificial/dielectric layers is formed over substrate 210, according to an embodiment. The layer stack 1002 has dielectric layers 1004-1 to 1004-4 alternating with sacrificial layers 1006-1 to 1006-4.

Dielectric layers 1004-1 to 1004-4 can each have the same thickness or have different thicknesses. Example thicknesses of dielectric layers 1004-1 to 1004-4 may range from 20 nm to 500 nm. Similarly, sacrificial layers 1006-1 to 1006-4 can each have the same thickness or have different thicknesses. Example thicknesses of sacrificial layers 1006-1 to 1006-4 may range from 20 nm to 500 nm. Dielectric layers 1004-1 to 1004-4 can include dielectric materials including, but not limited to, silicon oxide, silicon nitride, silicon oxynitride, or any combination thereof. Another dielectric material 1005 is deposited over layer stack 1002. Dielectric material 1005 has the same material composition of dielectric layers 1004-1 to 1004-4, according to some embodiments.

The dielectric material of sacrificial layers 1006-1 to 1006-4 is different than the dielectric material of dielectric layers 1004-1 to 1004-4, according to an embodiment. For example, each of sacrificial layers 1006-1 to 1006-4 may be silicon nitride while each of dielectric layers 1004-1 to 1004-4 may be silicon dioxide. Other example materials for each of sacrificial layers 1006-1 to 1006-4 include poly-crystalline silicon, poly-crystalline germanium, and poly-crystalline germanium-silicon. The dielectric materials used for any of dielectric layers 1004-1 to 1004-4 or sacrificial layers 1006-1 to 1006-4 may include silicon oxide, silicon nitride, silicon oxynitride, or any combination thereof. Although only four alternating dielectric pairs are illustrated in layer stack 1002, it should be understood that this is for illustrative purposes only and that any number of dielectric pairs may be included in layer stack 1002.

In an embodiment, layer stack 1002 over region B of structure 1000 includes a stair-case structure similar to the staircase structure described above for layer stack 502.

Figure 11A:
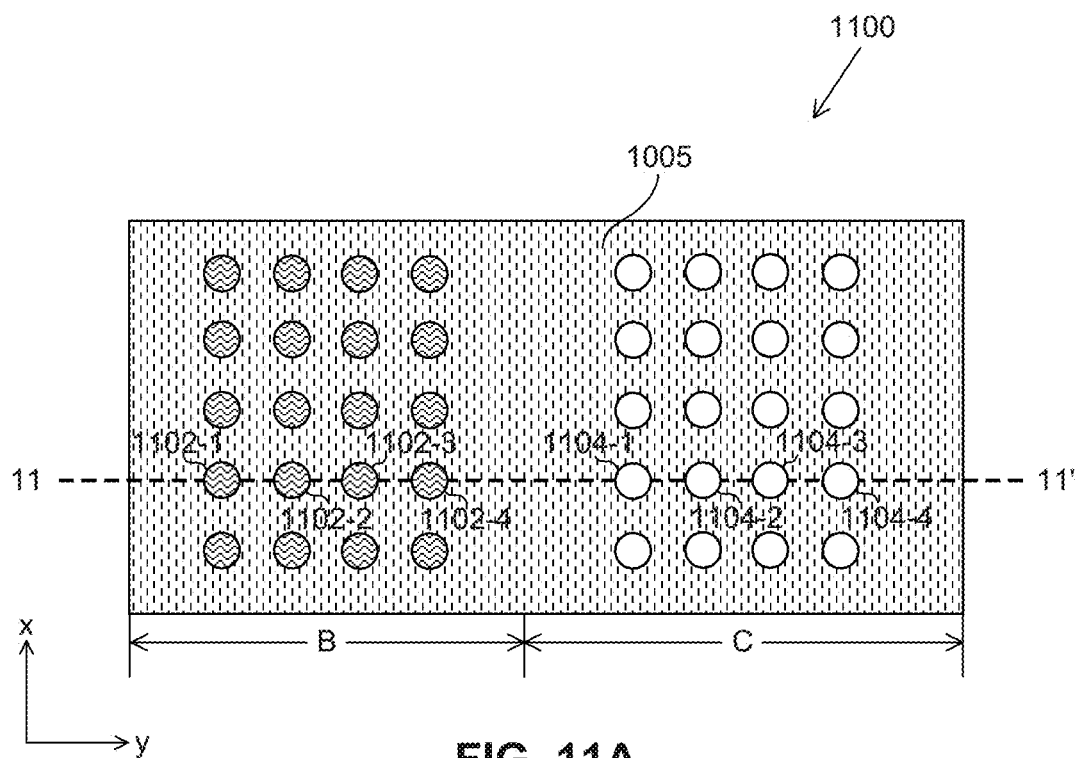
FIGS. 11A and 11B illustrate top and side views of another three-dimensional memory structure at a stage of an exemplary fabrication process, according to some embodiments.
Figure 11B:
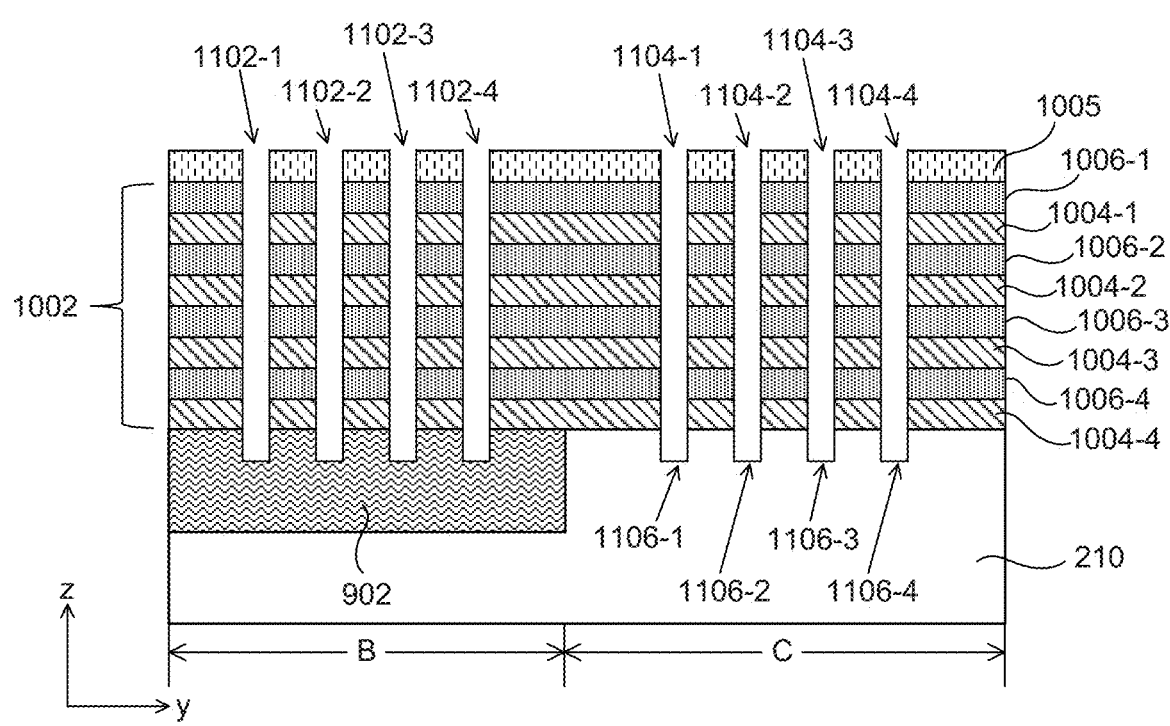

FIGS. 11A and 11B illustrate structure 1100 for forming another three-dimensional memory device, according to some embodiments. FIG. 11A is a top view of structure 1100, and FIG. 11B is a cross-sectional view of structure 1100 along the 11-11' direction.

According to an embodiment, a first plurality of holes 1102-1 to 1102-4 are etched through layer stack 1002 and aligned over insulating material 902 in a first region (e.g., region A) of substrate 210. Similarly, a second plurality of holes may be etched through layer stack 1002 within a second region (e.g., region B) of substrate 210. According to an embodiment, holes 1104-1 to 1104-4 are etched down into the material of substrate 210 such that recesses 1106-1 to 1106-4 are respectively formed within substrate 210. Holes 1104-1 to 1104-4 provide the space for the memory NAND strings to be formed within the core memory region (e.g., region B) of substrate 210, according to some embodiments. A diameter of holes 1104-1 to 1104-4 may be between about 100 nm and 200 nm.

Each of holes 1102-1 to 1102-4 and 1104-1 to 1104-4 may be etched through layer stack 1002 using an RIE process. Additionally, the etching of holes 1102-1 to 1102-4 may include etching through at least a portion of insulating material 902. According to an embodiment, the process of etching holes 1102-1 to 1102-4 does not etch into the material of substrate 210 due to the presence of insulating material 902.

As can be seen from the top view of structure 1100, an array of holes may be formed through layer stack 1002 in both regions A and B of substrate 210. It should be understood that any number of holes may be formed through layer stack 1002 in any pattern, as viewed from above.

Figure 12A:
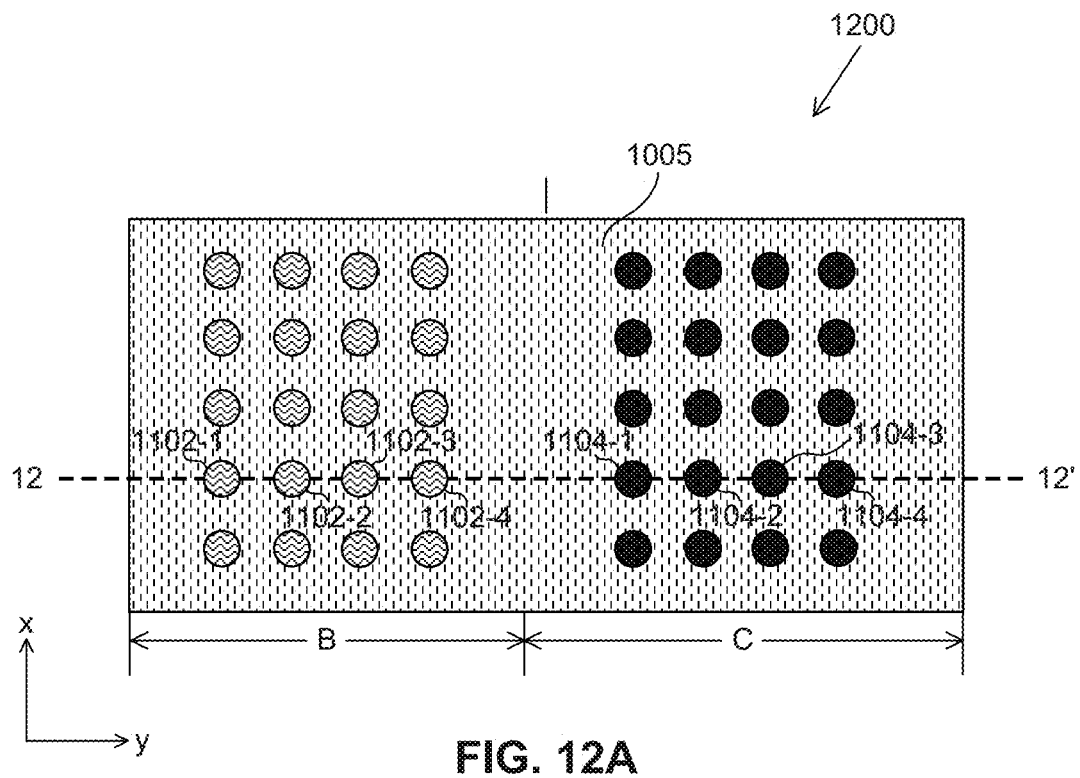
FIGS. 12A and 12B illustrate top and side views of another three-dimensional memory structure at a stage of an exemplary fabrication process, according to some embodiments.
Figure 12B:
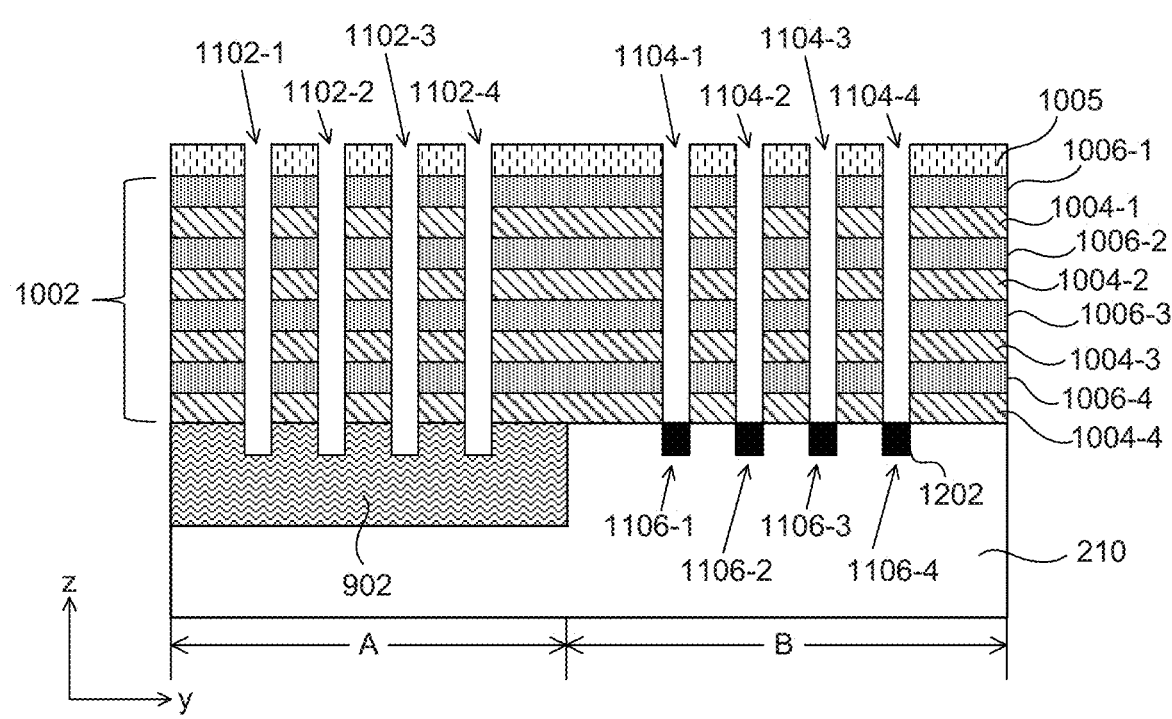

FIGS. 12A and 12B illustrate structure 1200 for forming another three-dimensional memory device, according to some embodiments. FIG. 12A is a top view of structure 1200, and FIG. 12B is a cross-sectional view of structure 1200 along the 12-12' direction.

According to some embodiments, an epitaxially grown material 1202 is formed within each of recesses 1106-1 to 1106-4 at the bottom of holes 1104-1 to 1104-4. Epitaxially grown material 1202 may be any semiconductor material that typically matches the semiconductor material of substrate 210. For example, when substrate 210 is silicon, epitaxially grown material 1202 may be epitaxially grown silicon.

According to some embodiments, epitaxially grown material 1202 does not form within any of holes 1102-1 to 1102-4. This is because holes 1102-1 to 1102-4 did not expose any part of substrate 210 due to the presence of insulating material 902. Without any exposed semiconductor substrate, there is no seed material present to initiate growth of the epitaxially grown material. By limiting growth of material 1202 to only those holes that will ultimately include the NAND memory strings, current leakage through the memory device is reduced and cell reliability is increased.

Figure 13A:
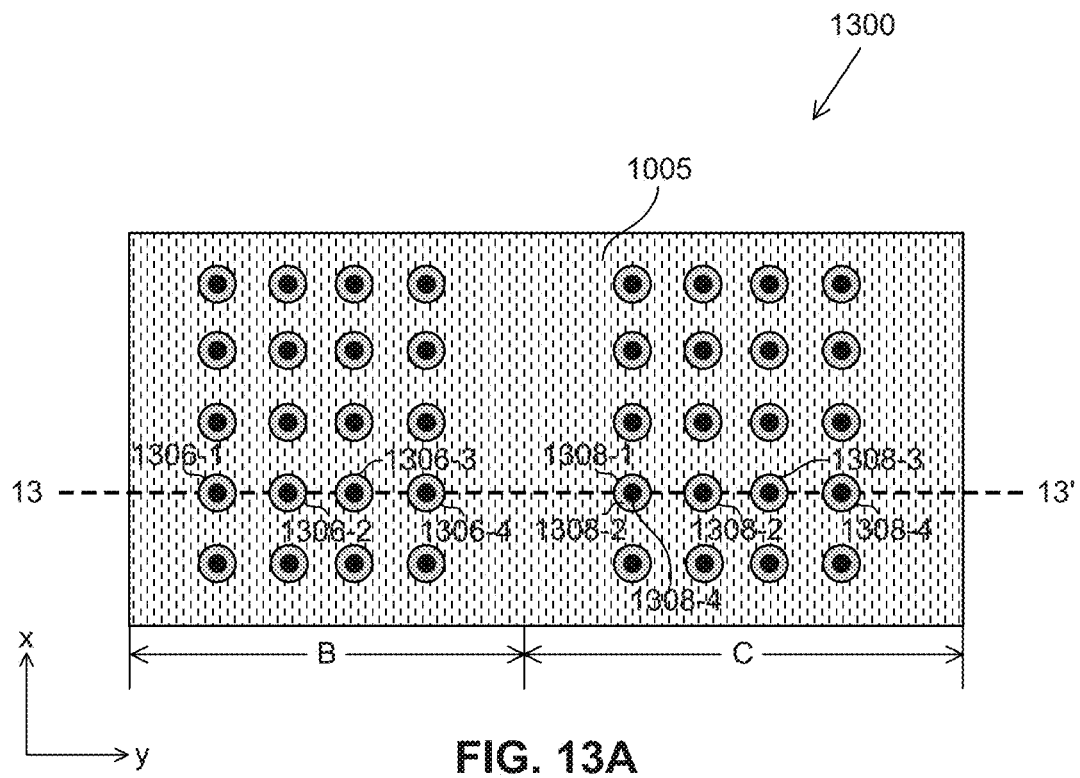
FIGS. 13A and 13B illustrate top and side views of another three-dimensional memory structure at a stage of an exemplary fabrication process, according to some embodiments.
Figure 13B:
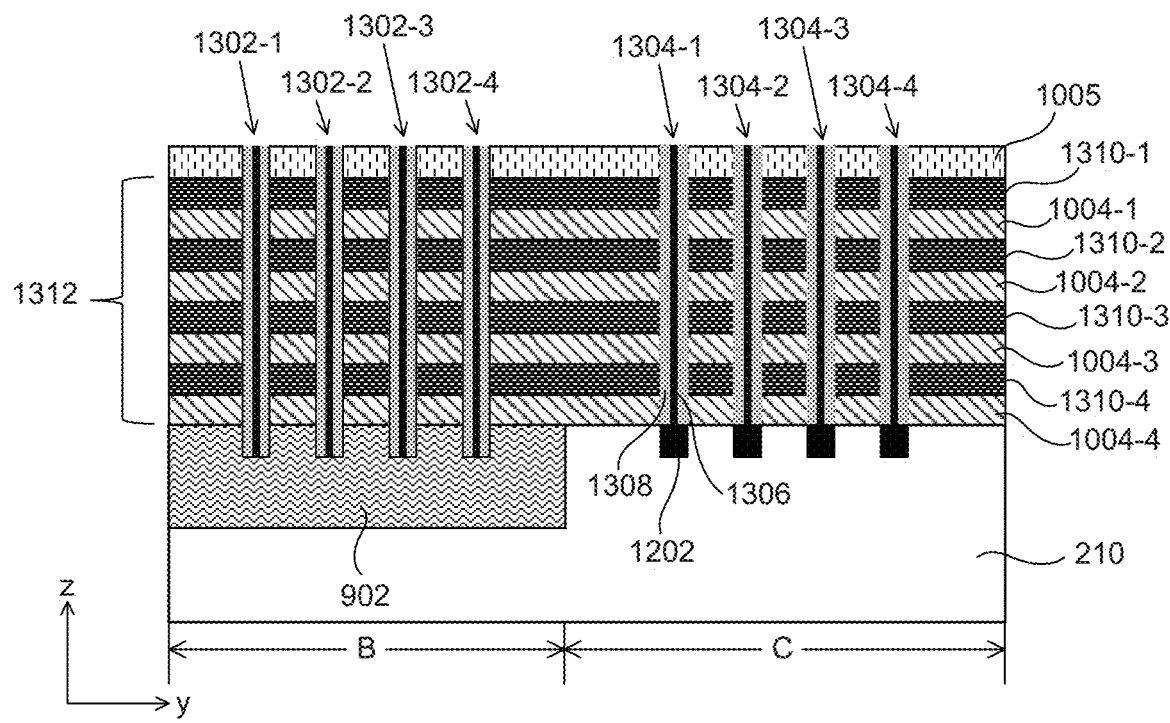

FIGS. 13A and 13B illustrate structure 1300 for forming another three-dimensional memory device, according to some embodiments. FIG. 13A is a top view of structure 1300, and FIG. 13B is a cross-sectional view of structure 1300 along the 13-13' direction. According to some embodiments, vertical structures 1302-1 to 1302-4 are formed within holes 1102-1 to 1102-4, respectively. Vertical structures 1302-1 to 1302-4 may be TACs that make electrical contact with a lowest or highest conductor layer 1004. Other examples of vertical structures 1302-1 to 1302-4 include electrically isolated dummy structures. For example, vertical structures 1302-1 to 1302-4 may be electrically isolated from all gate electrodes represented by conductor layers 1310-1 to 1310-4. Additionally, NAND strings 1304-1 to 1304-4 are formed over epitaxially grown material 1202 within holes 1106-1 to 1106-4, respectively. Each of NAND strings 1304-1 to 1304-4 and the word lines (e.g., conductor layers 1310-1 to 1310-4) can form memory cells, e.g., for storing data, of the three-dimensional memory device.

Each NAND string 1304 can substantially have a shape of a pillar along the z-axis and can include a plurality of layers surrounding one another. For example, each NAND string 1304 can include a semiconductor channel 1306 and a dielectric layer 1308 (also known as "memory film"). In some embodiments, semiconductor channel 1306 includes silicon, such as amorphous silicon, polysilicon, or single crystalline silicon. In some embodiments, dielectric layer 1308 is a composite layer including a tunneling layer, a storage layer (also known as "charge trap/storage layer"), and a blocking layer. Semiconductor channel 1306, the tunneling layer, the storage layer, and the blocking layer are arranged along a direction from the center toward the outer surface of the pillar in this order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, dielectric layer 1308 includes ONO dielectrics (e.g., a tunneling layer including silicon oxide, a storage layer including silicon nitride, and a blocking layer including silicon oxide).

Each of vertical structures 1302-1 to 1302-4 includes the same layer structure as NAND strings 1304-1 to 1304-4, according to some embodiments. For example, each of vertical structures 1302-1 to 1302-4 includes semiconductor channel 1306 and dielectric layer 1308, as described above.

According to an embodiment, sacrificial layers 1006-1 to 1006-4 of layer stack 1002 are removed and replaced with conductor layers 1310-1 to 1310-4 to form an alternating dielectric/conductor stack 1312. Sacrificial layers 1006-1 to 1006-4 can be removed by a suitable etching process, e.g., an isotropic dry etch or a wet etch. The etching process can have sufficiently high etching selectivity of the material of sacrificial layers 1006-1 to 1006-4 over the materials of other parts of structure 1300, such that the etching process can have minimal impact on the other parts of structure 1300. In some embodiments, sacrificial layers 1006-1 to 1006-4 include silicon nitride and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10 V. In some embodiments, sacrificial layers 1006-1 to 1006-4 include silicon nitride and the etchant of the wet etch includes phosphoric acid.

Conductor layers 1310-1 to 1310-4 can include conductor materials including, but not limited to, W, Co, Cu, Al, doped silicon, silicides, or any combination thereof. Each of conductor layers 1310-1 to 1310-4 can be deposited into the regions left behind by the removal of sacrificial layers 1006-1 to 1006-4 using a suitable deposition method such as CVD, sputtering, MOCVD, and/or ALD.

Figure 14:
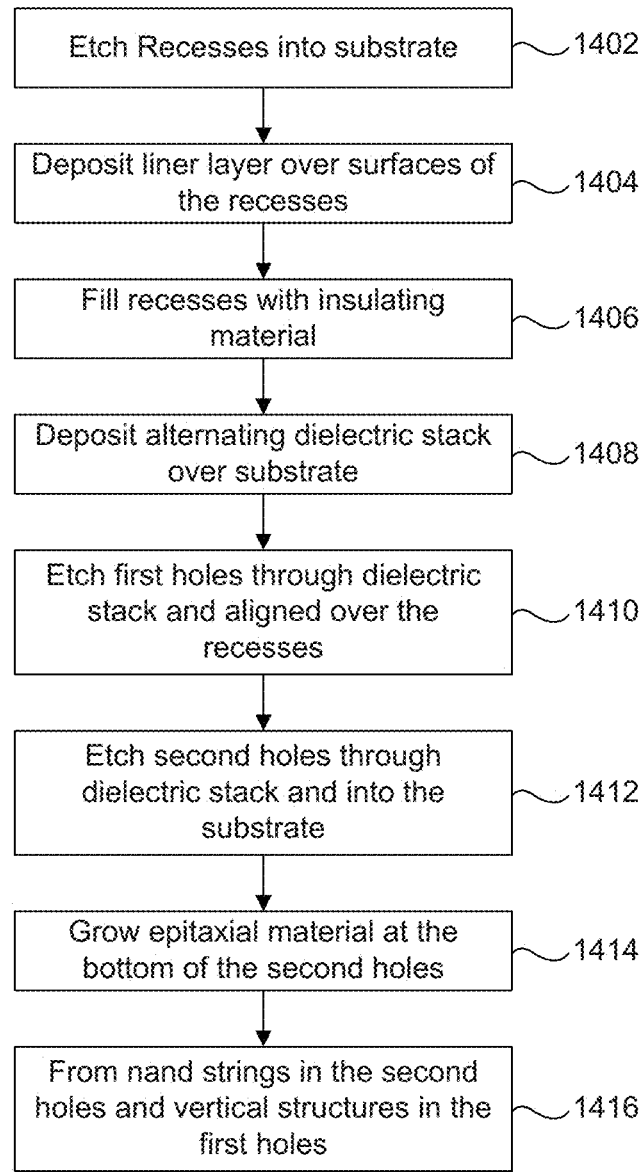
FIG. 14 is an illustration of a fabrication process for forming a three-dimensional memory structure, according to some embodiments.

FIG. 14 is a flowchart of an exemplary method 1400 for forming a NAND memory device, according to some embodiments. The operations of method 1400 are generally illustrated in FIGS. 2-8. It should be understood that the operations shown in method 1400 are not exhaustive and that other operations can be performed as well before, after, or between any of the illustrated operations. In various embodiments of the present disclosure, the operations of method 1400 can be performed in a different order and/or vary.

In operation 1402, a plurality of recesses is etched into a substrate. The substrate can include any suitable material for forming the three-dimensional memory structure. For example, the substrate can include silicon, silicon germanium, silicon carbide, silicon on insulator (SOI), germanium on insulator (GOI), glass, gallium nitride, gallium arsenide, and/or other suitable compound.

The plurality of recesses may be etched in a first region of the substrate. The plurality of recesses may be formed using conventional lithography techniques as would be understood to a person skilled in the relevant art. Such conventional techniques include depositing a masking layer, patterning the masking layer using a photoresist, and etching the exposed substrate to form each of the recesses. The etching may be performed using well known wet or dry techniques, such as reactive ion etching (RIE) or etching with potassium hydroxide (KOH), to name a few examples.

In operation 1404, a liner layer is deposited over the surfaces of the plurality of recesses. The liner layer may cover the sidewalls and bottom surfaces of the plurality of recesses. The liner layer may have a thickness between about 2 nm and about 20 nm and may include a dielectric material such as TiN, TaN, $Al_2O_3$, $HfO_2$, or $Ta_2O_5$.

The liner layer may be deposited using conventional deposition techniques. For example, the liner layer may be deposited using CVD. Example CVD techniques include PECVD, LPCVD, and ALD. The liner layer may also be deposited using HDP.

In operation 1406, the recesses are filled with an insulating material. The insulating material may be silicon dioxide or silicon nitride. The insulating material may be deposited using conventional deposition techniques. For example, the insulating material may be deposited using CVD. Example CVD techniques include PECVD, LPCVD, and ALD. The insulating material may also be deposited using HDP.

According to an embodiment, following the deposition of the insulating material, a top surface of the substrate is polished to form a planar surface across the top of the substrate. The polishing also removes the liner layer from the top surface of the substrate, such that, following the polishing, the liner layer exists only along the sidewalls and bottom surface of each of the recesses. The polishing may be performed using chemical mechanical polishing (CMP).

In operation 1408, an alternating sacrificial/dielectric stack is deposited over the substrate. The layers of the alternating sacrificial/dielectric stack can include materials including, but not limited to, silicon oxide, silicon nitride, silicon oxynitride, or any combination thereof. The layers of the alternating sacrificial/dielectric stack can include dielectric materials deposited by one or more thin film deposition processes including, but not limited to, CVD, PVD, ALD, or any combination thereof.

In operation 1410, a plurality of first holes are etched through the alternating sacrificial/dielectric stack and are aligned over the plurality of recesses formed in operation 1402. Each of the plurality of first holes may be etched through the alternating dielectric stack using an RIE process. Additionally, the etching of the holes may include etching through at least a portion of the insulating material disposed in the recesses during operation 1406. According to an embodiment, the process of etching the plurality of first holes does not etch into the material of the substrate due to the presence of the liner layer deposited during operation 1404.

In operation 1412, a plurality of second holes are etched through the alternating sacrificial/dielectric stack and also through a portion of the substrate material. The plurality of second holes are etched down into the material of the substrate such that additional recesses are formed within the substrate. The plurality of second holes provide the space for the memory NAND strings to be formed within a core memory region of the substrate, according to some embodiments. The plurality of second holes may be in a different region of the substrate compared to the plurality of first holes etched during operation 1410.

In operation 1414, epitaxial material is grown within the additional recesses formed in the substrate due to the etching of the plurality of second holes. The epitaxially grown material may be any semiconductor material that typically matches the semiconductor material of the substrate. For example, when the substrate is silicon, the epitaxially grown material may be epitaxially grown silicon.

According to some embodiments, the epitaxially grown material does not form within any of the plurality of first holes. This is because the plurality of first holes do not expose any part of the substrate due to the presence of the pre-etched recesses from operation 1402 and the liner layer deposited during operation 1404. Without any exposed semiconductor substrate, there is no seed material present to initiate growth of the epitaxially grown material.

In operation 1416, NAND strings are formed within the plurality of second holes and vertical structures are formed within the plurality of first holes. The vertical structures may be dummy structures that are electrically isolated from any other portions of the memory device. Also, the sacrificial layers of the alternating sacrificial/dielectric stack may be removed and replaced by conductor layers to form an alternating conductor/dielectric stack during, or after, operation 1416. Each of the NAND strings and the word lines (e.g., the conductor layers of the alternating conductor/dielectric stack) can form memory cells, e.g., for storing data, of the three-dimensional memory device.

In some embodiments, fabrication processes to form the NAND strings and the vertical structures include forming a semiconductor channel that extends vertically through the alternating conductor/dielectric stack, and forming a dielectric layer between the semiconductor channel and the alternating conductor/dielectric stack. The dielectric layer can be a composite dielectric layer, such as a combination of multiple dielectric layers including, but not limited to, a tunneling layer, a storage layer, and a blocking layer. The tunneling layer can include dielectric materials including, but not limited to, silicon oxide, silicon nitride, silicon oxynitride, or any combination thereof. The storage layer can include materials for storing charge for memory operation. The storage layer materials include, but are not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon nitride/silicon oxide (ONO). The blocking layer can further include a high-k dielectric layer (e.g., aluminum oxide). The dielectric layer can be formed by processes such as ALD, CVD, PVD, any other suitable processes, or any combination thereof.

Figure 15:
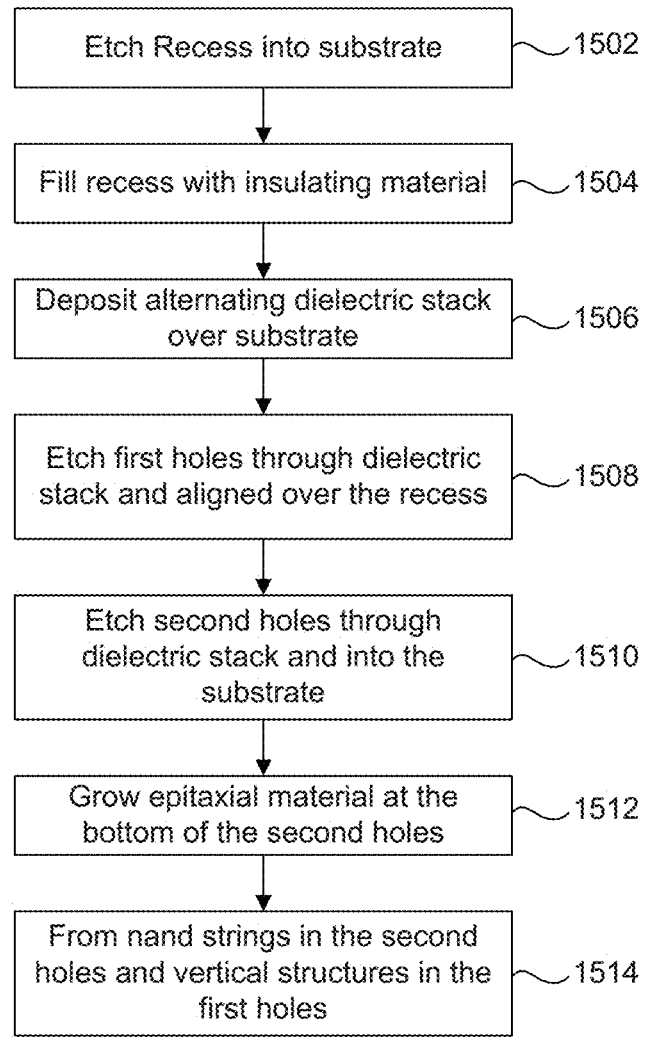
FIG. 15 is an illustration of another fabrication process for forming a three-dimensional memory structure, according to some embodiments.

FIG. 15 is a flowchart of an exemplary method 1500 for forming another NAND memory device, according to some embodiments. The operations of method 1500 are generally illustrated in FIGS. 9-13. It should be understood that the operations shown in method 1500 are not exhaustive and that other operations can be performed as well before, after, or between any of the illustrated operations. In various embodiments of the present disclosure, the operations of method 1500 can be performed in a different order and/or vary.

In operation 1502, a recess is etched into a substrate in a first region of the substrate. The substrate can include any suitable material for forming the three-dimensional memory structure. For example, the substrate can include silicon, silicon germanium, silicon carbide, silicon on insulator (SOI), germanium on insulator (GOI), glass, gallium nitride, gallium arsenide, and/or other suitable compound.

The recess may be formed using conventional lithography techniques as would be understood to a person skilled in the relevant art. Such conventional techniques include depositing a masking layer, patterning the masking layer using a photoresist, and etching the exposed substrate to form the recess. The etching may be performed using well known wet or dry techniques, such as reactive ion etching (RIE) or etching with potassium hydroxide (KOH), to name a few examples.

In an embodiment, after the formation of the recess, an insulating etch stop liner layer may be deposited over the sidewalls and bottom surface of the recess. The insulating etch stop liner layer may be TiN, TaN, $Al_2O_3$, $HfO_2$, or $Ta_2O_5$. The liner layer may be deposited using conventional deposition techniques. For example, the liner layer may be deposited using CVD. Example CVD techniques include PECVD, LPCVD, and ALD. The liner layer may also be deposited using HDP.

In operation 1504, the recess is filled with an insulating material. The insulating material may be silicon oxide or silicon nitride. The insulating material may be deposited using conventional deposition techniques. For example, the insulating material may be deposited using CVD. Example CVD techniques include PECVD, LPCVD, and ALD. The insulating material may also be deposited using HDP.

According to an embodiment, following the deposition of the insulating material, a top surface of the substrate is polished to form a planar surface across the top of the substrate. The polishing may be performed using chemical mechanical polishing (CMP). The final insulating material may have a thickness within the recess of between about 0.5 µm and about 2 µm.

In operation 1506, an alternating sacrificial/dielectric stack is deposited over the substrate. The layers of the alternating sacrificial/dielectric stack can include materials including, but not limited to, silicon oxide, silicon nitride, silicon oxynitride, or any combination thereof. The layers of the alternating sacrificial/dielectric stack can include dielectric materials deposited by one or more thin film deposition processes including, but not limited to, CVD, PVD, ALD, or any combination thereof.

In operation 1508, a plurality of first holes are etched through the alternating sacrificial/dielectric stack and are aligned over the recess formed in operation 1502. Each of the plurality of first holes may be etched through the alternating sacrificial/dielectric stack using an RIE process. Additionally, the etching of the holes may include etching through at least a portion of the insulating material disposed in the recess during operation 1504. According to an embodiment, the process of etching the plurality of first holes does not etch into the material of the substrate due to the presence of the insulating material.

In operation 1510, a plurality of second holes are etched through the alternating sacrificial/dielectric stack and also through a portion of the substrate material. The plurality of second holes are etched down into the material of the substrate such that additional recesses are formed within the substrate. The plurality of second holes provide the space for the memory NAND strings to be formed within a core memory region of the substrate, according to some embodiments. The plurality of second holes may be in a different region of the substrate compared to the plurality of first holes etched during operation 1508.

In operation 1512, epitaxial material is grown within the additional recesses formed in the substrate due to the etching of the plurality of second holes. The epitaxially grown material may be any semiconductor material that typically matches the semiconductor material of the substrate. For example, when the substrate is silicon, the epitaxially grown material may be epitaxially grown silicon.

According to some embodiments, the epitaxially grown material does not form within any of the plurality of first holes. This is because the plurality of first holes do not expose any part of the substrate due to the presence of the insulating material. Without any exposed semiconductor substrate, there is no seed material present to initiate growth of the epitaxially grown material.

In operation 1514, NAND strings are formed within the plurality of second holes and vertical structures are formed within the plurality of first holes. The vertical structures may be TACs that make electrical contact with components above and/or below the alternating sacrificial/dielectric stack. Also, the sacrificial layers of the alternating sacrificial/dielectric stack may be removed and replaced by conductor layers to form an alternating conductor/dielectric stack during, or after, operation 1514. Each of the NAND strings and the word lines (e.g., the conductor layers of the alternating conductor/dielectric stack) can form memory cells, e.g., for storing data, of the three-dimensional memory device.

In some embodiments, fabrication processes to form the NAND strings and the vertical structures include forming a semiconductor channel that extends vertically through the alternating conductor/dielectric stack, and forming a dielectric layer between the semiconductor channel and the alternating conductor/dielectric stack. The dielectric layer can be a composite dielectric layer, such as a combination of multiple dielectric layers including, but not limited to, a tunneling layer, a storage layer, and a blocking layer. The tunneling layer can include dielectric materials including, but not limited to, silicon oxide, silicon nitride, silicon oxynitride, or any combination thereof. The storage layer can include materials for storing charge for memory operation. The storage layer materials include, but are not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon nitride/silicon oxide (ONO). The blocking layer can further include a high-k dielectric layer (e.g., aluminum oxide). The dielectric layer can be formed by processes such as ALD, CVD, PVD, any other suitable processes, or any combination thereof.

The present disclosure describes various embodiments of three-dimensional NAND memory device and methods of making the same. In some embodiments, a first three-dimensional memory device includes a substrate having a first plurality of recesses in a first region and a second plurality of recesses in a second region. A liner layer is disposed over the sidewalls and bottom of the first plurality of recesses in the first region and an epitaxially-grown material is formed in the second plurality of recesses in the second region. A plurality of NAND strings are formed over the epitaxially-grown material disposed in the second plurality of recesses and a plurality of vertical structures are formed over the first plurality of recesses in the first region.

In some embodiments, the method to form the first three-dimensional memory device includes: forming a first plurality of recesses in a first region of a substrate, and forming a liner layer over the sidewalls and bottom of the first plurality of recesses. The method also includes filling the first plurality of recesses with an insulating material. The method includes forming an alternating conductor/dielectric stack on the substrate. The method further includes forming a first plurality of holes through the alternating conductor/dielectric stack, and forming a second plurality of holes through the alternating conductor/dielectric stack and through a portion of the substrate in a second region of the substrate. The first plurality of holes are aligned over the first plurality of recesses in the first region of the substrate. Forming the second plurality of holes forms a second plurality of recesses in the second region of the substrate. The method further includes forming a material in the second plurality of recesses. The method also includes forming a plurality of NAND strings in the second plurality of holes and forming a plurality of vertical structures in the first plurality of holes.

In some embodiments, a second three-dimensional memory device includes a substrate having a first region and a second region, where the first region includes a first recess and the second region includes a plurality of recesses. An insulating material fills the first recess in the first region of the substrate, and an epitaxially-grown material is formed in the plurality of recesses in the second region. A plurality of NAND strings are formed over the epitaxially-grown material disposed in the second plurality of recesses, and a plurality of vertical structures are formed over the insulating material in the first region.

In some embodiments, the method to form the second three-dimensional memory device includes: forming a recess in a first region of a substrate, and filling the recess with an insulating material. The method includes forming an alternating conductor/dielectric stack on the substrate. The method further includes forming a first plurality of holes through the alternating conductor/dielectric stack, and forming a second plurality of holes through the alternating conductor/dielectric stack and through a portion of the substrate in a second region of the substrate. The first plurality of holes are aligned over the insulating material. Forming the second plurality of holes forms a plurality of recesses in the second region of the substrate. The method further includes forming a material in the plurality of recesses. The method also includes forming a plurality of NAND strings in the second plurality of holes and forming a plurality of vertical structures in the first plurality of holes.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A NAND memory device, comprising:
   a substrate having one or more first recesses in a first region and one or more second recesses in a second region;
   a liner layer disposed over sidewalls and bottom of the one or more first recesses in the first region;
   an epitaxially-grown material formed in the one or more second recesses in the second region;
   one or more NAND strings formed over the epitaxially-grown material disposed in the one or more second recesses; and
   one or more vertical structures formed over the one or more first recesses in the first region, wherein each of the one or more NAND strings and each of the one or more vertical structures comprise an inner semiconductor channel and an outer dielectric layer.

2. The NAND memory device of claim 1, further comprising an alternating conductor/dielectric stack disposed on the substrate.

3. The NAND memory device of claim 1, wherein the liner layer comprises a material selected from a list consisting of TiN, TaN, $Al_2O_3$, $HfO_2$, and $Ta_2O_5$.

4. The NAND memory device of claim 1, wherein the liner layer has a thickness between 5 nm and 20 nm.

5. The NAND memory device of claim 1, wherein the one or more vertical structures comprise one or more electrically isolated dummy structures.

6. The NAND memory device of claim 1, wherein the substrate further comprises one or more third recesses in a third region, wherein the liner layer is disposed over sidewalls and bottom of the one or more third recesses in the third region, and wherein the one or more third recesses are filled with an insulating material.

7. The NAND memory device of claim 1, wherein the outer dielectric layer comprises a tunneling layer, a storage layer and a blocking layer.

8. The NAND memory device of claim 7, wherein the outer dielectric layer comprises a composite layer of silicon oxide/silicon nitride/silicon oxide.

9. The NAND memory device of claim 1, wherein the inner semiconductor channel comprises amorphous silicon, polysilicon silicon, or crystalline silicon.

10. The NAND memory device of claim 1, further comprising:
a staircase structure in the first region, wherein at least some of the one or more vertical structures penetrate vertically through the staircase structure.

11. A method for forming a NAND memory device, comprising:
forming one or more first recesses in a first region of a substrate;
forming a liner layer over sidewalls and bottom of the one or more first recesses;
filling the one or more first recesses with an insulating material;
forming an alternating sacrificial/dielectric stack over the substrate;
forming one or more first holes through the alternating sacrificial/dielectric stack, the one or more first holes being aligned over the one or more first recesses;
forming one or more second holes through the alternating sacrificial/dielectric stack and through a portion of the substrate in a second region of the substrate, thereby forming one or more second recesses in the second region of the substrate;
forming a material in the one or more second recesses;
forming one or more NAND strings in the one or more second holes after forming the one or more first and second holes; and
forming one or more vertical structures in the one or more first holes.

12. The method of claim 11 wherein forming the one or more first recesses comprises etching the substrate using a reactive ion etch (RIE) process.

13. The method of claim 11, further comprising polishing a top surface of the substrate after filling the one or more first recesses with the insulating material.

14. The method of claim 11, wherein forming the liner layer comprises depositing the liner layer using a chemical vapor deposition (CVD) technique.

15. The method of claim 11, wherein forming the one or more first holes further comprises forming the one or more first holes through at least a portion of the insulating material in the one or more first recesses.

16. The method of claim 11, wherein forming the liner layer comprises depositing the liner layer to a thickness between 5 nm and 20 nm.

17. The method of claim 11, wherein forming the material in the one or more second recesses comprises forming an epitaxially-grown material in the one or more second recesses.

18. The method of claim 11, wherein forming the one or more NAND strings comprises:
disposing a dielectric layer on a sidewall of each of the one or more second holes; and
disposing a semiconductor channel on a dielectric layer in each of the one or more second holes.

19. The method of claim 18, wherein forming the one or more vertical structures comprises:
disposing the dielectric layer on a sidewall of each of the one or more first holes; and
disposing the semiconductor channel on the dielectric layer in each of the one or more first holes.

20. The method of claim 18, wherein disposing the dielectric layer comprises disposing a tunneling layer, a storage layer and a blocking layer.

* * * * *